United States Patent
Wu

(10) Patent No.: US 11,723,201 B2
(45) Date of Patent: Aug. 8, 2023

(54) METHOD OF FORMING THREE-DIMENSIONAL MEMORY DEVICE WITH EPITAXIALLY GROWN LAYERS

(71) Applicant: Yangtze Memory Technologies Co., Ltd., Wuhan (CN)

(72) Inventor: Linchun Wu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 8 days.

(21) Appl. No.: 16/896,792

(22) Filed: Jun. 9, 2020

(65) Prior Publication Data
US 2021/0225865 A1   Jul. 22, 2021

Related U.S. Application Data

(63) Continuation of application No. PCT/CN2020/088401, filed on Apr. 30, 2020.

(30) Foreign Application Priority Data

Jan. 17, 2020 (CN) .......................... 202010054215.7

(51) Int. Cl.
*H10B 43/27* (2023.01)
*H10B 43/10* (2023.01)
*H10B 43/35* (2023.01)

(52) U.S. Cl.
CPC ............. *H10B 43/27* (2023.02); *H10B 43/10* (2023.02); *H10B 43/35* (2023.02)

(58) Field of Classification Search
CPC ...... H01L 27/115–11597; H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44;
(Continued)

(56) References Cited

U.S. PATENT DOCUMENTS

| 10,199,359 B1 | 2/2019 | Sakakibara et al. |
| 2012/0001252 A1* | 1/2012 | Alsmeier .......... H01L 27/11578 257/E21.679 |

(Continued)

FOREIGN PATENT DOCUMENTS

| CN | 107017264 A | 8/2017 |
| CN | 108063142 A | 5/2018 |

(Continued)

*Primary Examiner* — Didarul A Mazumder
*Assistant Examiner* — Gustavo G Ramallo
(74) *Attorney, Agent, or Firm* — Anova Law Group, PLLC

(57) ABSTRACT

Three-dimensional (3D) NAND memory devices and methods are provided. In one aspect, a 3D NAND memory device includes a substrate, a layer stack over the substrate, a first epitaxial layer, a second epitaxial layer, first array common sources (ACS's), and second ACS's. The layer stack includes first stack layers and second stack layers that are alternately stacked. The first epitaxial layer is deposited on a side portion of a channel layer that extends through the layer stack. The second epitaxial layer is deposited on the substrate. The first ACS's and a portion of the layer stack are between the second ACS's.

18 Claims, 14 Drawing Sheets

(58) Field of Classification Search
CPC .. H10B 41/46–50; H10B 41/60; H10B 41/70;
H10B 43/00; H10B 43/10; H10B 43/20;
H10B 43/23; H10B 43/27; H10B 43/30;
H10B 43/35; H10B 43/40; H10B 43/50;
H10B 51/00; H10B 51/10; H10B 51/20;
H10B 51/30; H10B 51/40; H10B 51/50
See application file for complete search history.

(56) References Cited

U.S. PATENT DOCUMENTS

| | | | |
|---|---|---|---|
| 2014/0035026 A1 | 2/2014 | Jang et al. | |
| 2014/0239375 A1* | 8/2014 | Kim | H01L 29/7926 438/269 |
| 2016/0343730 A1* | 11/2016 | Son | H01L 27/11582 |
| 2018/0097009 A1 | 4/2018 | Zhang et al. | |
| 2019/0123369 A1 | 4/2019 | Ma et al. | |
| 2019/0157294 A1 | 5/2019 | Kanamori et al. | |
| 2019/0288000 A1 | 9/2019 | Choi | |
| 2020/0185412 A1* | 6/2020 | Lee | H10B 43/27 |
| 2021/0104526 A1* | 4/2021 | Son | H01L 27/10873 |
| 2021/0193574 A1* | 6/2021 | Sun | H01L 23/535 |

FOREIGN PATENT DOCUMENTS

| | | |
|---|---|---|
| CN | 108695339 A | 10/2018 |
| CN | 109103200 A | 12/2018 |
| CN | 109155319 A | 1/2019 |
| CN | 109285842 A | 1/2019 |
| CN | 109411475 A | 3/2019 |
| CN | 109690776 A | 4/2019 |
| CN | 109727995 A | 5/2019 |
| CN | 109742083 A | 5/2019 |
| CN | 109997226 A | 7/2019 |
| CN | 110112134 A | 8/2019 |
| CN | 110416219 A | 11/2019 |
| EP | 3486951 A1 | 5/2019 |
| JP | 2013534058 A | 8/2013 |

\* cited by examiner

METHOD OF FORMING THREE-DIMENSIONAL MEMORY DEVICE WITH EPITAXIALLY GROWN LAYERS

CROSS-REFERENCE TO RELATED APPLICATION

This application claims the priority to Chinese Patent Application No. 202010054215.7, filed on Jan. 17, 2020 and PCT Patent Application No. PCT/CN2020/088401 filed on Apr. 30, 2020, the entire content of which is incorporated herein by reference.

FIELD OF THE TECHNOLOGY

This application relates to the field of semiconductor technology and, specifically, to a three-dimensional (3D) semiconductor memory device and fabrication method thereof.

BACKGROUND OF THE DISCLOSURE

Not-AND (NAND) memory is a non-volatile type of memory that does not require power to retain stored data. The growing demands of consumer electronics, cloud computing, and big data bring about a constant need of NAND memories of larger capacity and better performance. As conventional two-dimensional (2D) NAND memory approaches its physical limits, three-dimensional (3D) NAND memory is now playing an important role. 3D NAND memory uses multiple stack layers in a single chip to achieve higher density, higher capacity, faster performance, lower power consumption, and better cost efficiency.

During the fabrication of a 3D NAND memory device, gate line slits (GLS's) are formed to expose a sacrificial layer above the substrate. Then, a cavity is etched and selective epitaxial growth of single crystalline silicon and polysilicon is performed in the cavity. As the epitaxial growth close to openings of the cavity is faster, voids are left in the middle of the cavity when the openings are filled. The voids can cause leakage of electrical current and reliability issues.

The GLS's are also used to form the gate electrodes in a layer stack. Before the gate electrodes are made, sacrificial stack layers of the layer stack are etched away. However, some portions of the sacrificial layers that are farther away from the GLS's often are etched incompletely. Thus, certain portions of the gate electrodes can only be made partially, which leads to the failure of an NAND memory cell.

The disclosed methods and systems are directed to solve one or more problems set forth above and other problems.

SUMMARY

In one aspect of the present disclosure, a 3D NAND memory device includes a substrate, a layer stack over the substrate, a first epitaxial layer, a second epitaxial layer, first array common sources (ACS's), and second ACS's. The layer stack includes memory blocks and first stack layers and second stack layers that are alternately stacked. The first epitaxial layer is deposited on a side portion of a channel layer that extends through the layer stack. The second epitaxial layer is deposited on the substrate. The first ACS's and second ACS's are configured for each memory block and extend through the layer stack. The first epitaxial layer adjoins the second epitaxial layer. The first ACS's and the second ACS's are electrically connected with the second epitaxial layer. The first ACS's and a portion of the layer stack are between the second ACS's.

In another aspect of the present disclosure, a fabrication method for a 3D NAND memory device includes forming a layer stack over a substrate, performing an epitaxial growth to deposit a first epitaxial layer on a side portion of a channel layer that extends through the layer stack and deposit a second epitaxial layer on the substrate, and forming first gate line slits (GLS's) and second GLS's that extend through the layer stack for each memory block. The layer stack includes first stack layers and second stack layers that are alternately stacked. The first epitaxial layer adjoins the second epitaxial layer. The first GLS's and a portion of the layer stack are between the second GLS's.

In another aspect of the present disclosure, another fabrication method for a 3D NAND memory device includes forming a layer stack over a substrate, performing an epitaxial growth to deposit a first epitaxial layer on a side portion of a channel layer that extends through the layer stack and deposit a second epitaxial layer on the substrate, and forming first array common sources (ACS's) and second ACS's that extend through the layer stack for each memory block. The layer stack includes first stack layers and second stack layers alternately stacked. The first epitaxial layer adjoins the second epitaxial layer. The first ACS's and the second ACS's are electrically connected with the second epitaxial layer. The first ACS's and a portion of the layer stack are between the second ACS's.

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all the embodiments of the present disclosure. Features in various embodiments may be exchanged and/or combined. Other embodiments obtained by a person skilled in the art based on the embodiments of the present disclosure without creative efforts shall fall within the scope of the present disclosure.

Figure 1:
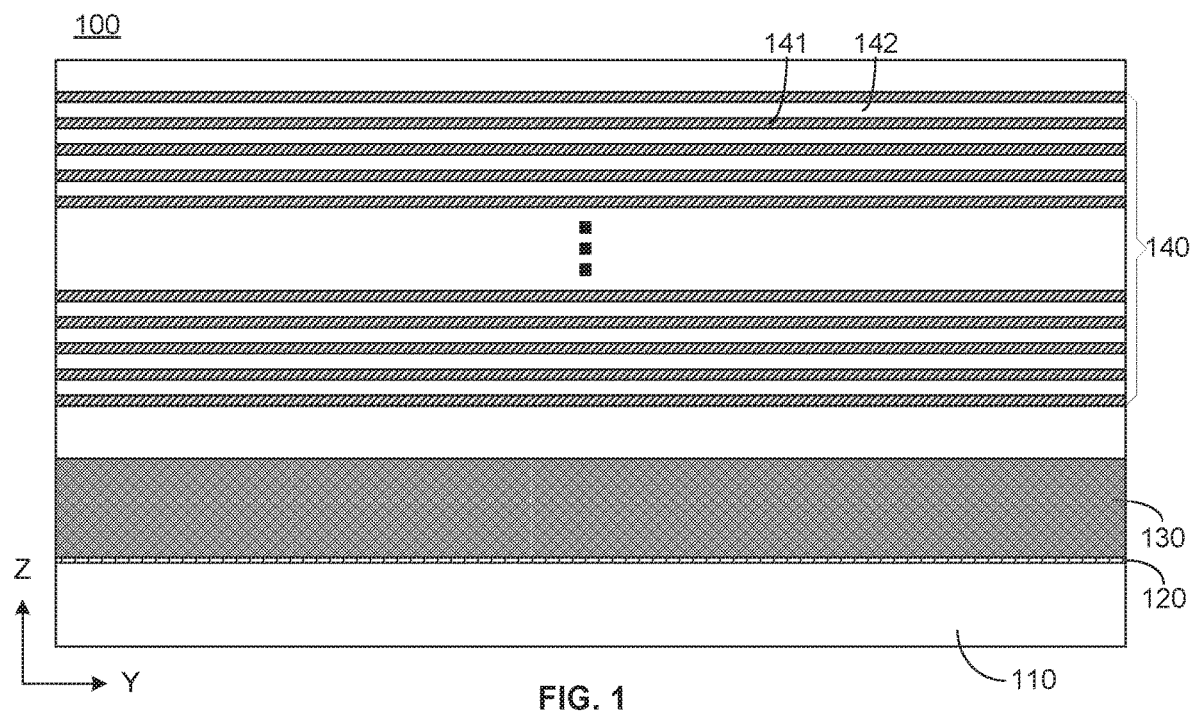
FIG. 1 illustrates schematically a cross-sectional view of a three-dimensional (3D) memory device in an exemplary fabrication process according to embodiments of the present disclosure.

FIGS. 1-12 schematically show a fabrication process of an exemplary 3D memory device 100 according to embodiments of the present disclosure. Among FIGS. 1-12, cross-sectional views are in the Y-Z plane and top views are in the X-Y plane. As shown in FIG. 1, the 3D memory device 100 includes a substrate 110. In some embodiments, the substrate 110 may include a single crystalline silicon layer. In some other embodiments, the substrate 110 may include another semiconductor material such as germanium (Ge), silicon-germanium (SiGe), silicon carbide (SiC), silicon-on-insulator (SOI), germanium-on-insulator (GOI), polycrystalline silicon (polysilicon), a III-V compound such as gallium arsenide (GaAs) or indium phosphide (InP), etc. In some other embodiments, the substrate 110 may include an electrically non-conductive material such as glass, a plastic material, or a ceramic material. In the following descriptions, as an example, the substrate 110 includes an undoped or light doped single crystalline silicon layer. In some other embodiments, the substrate 110 may be doped differently with p-type or n-type dopants. When the substrate 110 includes glass, plastic, or ceramic material, the substrate 110 may further include a thin layer of polysilicon deposited on the glass, plastic, or ceramic material, such that the substrate 110 may be processed like a polysilicon substrate.

As shown in FIG. 1, a cover layer 120 may be deposited over the substrate 110. The cover layer 120 is a sacrificial layer and may include a single layer or a composite layer including multiple layers. For example, the layer 120 may include one or more of silicon oxide layer and silicon nitride layer. The layer 120 may be deposited by chemical vapor deposition (CVD), physical vapor deposition (PVD), atomic layer deposition (ALD), or a combination of two or more of these methods. In some other embodiments, the layer 120 may include another material such as aluminum oxide.

Over the cover layer 120, a sacrificial layer 130 may be deposited. The sacrificial layer 130 may include a dielectric material, a semiconductive material, or a conductive material. For example, the layer 130 may be single crystalline silicon or polysilicon, which may be deposited by a CVD and/or PVD process. In descriptions bellow, an exemplary material for the layer 130 is polysilicon. After the polysilicon layer 130 is formed, a layer stack 140 may be deposited. The layer stack 140 includes multiple pairs of stack layers 141 and 142, i.e., the layers 141 and 142 are stacked alternately. For example, the layer stack may include 64 pairs, 128 pairs, or more than 128 pairs of the layers 141 and 142.

In some embodiments, the layers 141 and 142 may include a first dielectric material and a second dielectric material that is different from the first dielectric material, respectively. The alternating layers 141 and 142 may be deposited via CVD, PVD, ALD, or a combination of two or more of these processes. In discussions bellow, exemplary materials for the layers 141 and 142 are silicon oxide and silicon nitride, respectively. The silicon oxide layer 141 may be configured as an isolation layer and the silicon nitride layer 142 may be configured as a sacrificial layer. The sacrificial stack layer 142 will be etched out and replaced by a conductor layer during the fabrication process. In some other embodiments, different materials may be used to form the alternating stack layers 141 and 142. For example, the layers 141 and 142 may include dielectric materials other than silicon oxide and/or silicon nitride. Further, in some other embodiments, the layers 141 and 142 may include a dielectric layer and a conductive layer. The conductive layer may include, e.g., tungsten (W), cobalt (Co), copper (Cu), aluminum (Al), doped silicon, or silicide. In discussions below, as aforementioned, the layers 141 and 142 include silicon oxide and silicon nitride, respectively. Further, the silicon nitride layer 142 is configured as the sacrificial layer that will be etched away in the fabrication process.

Figure 2:
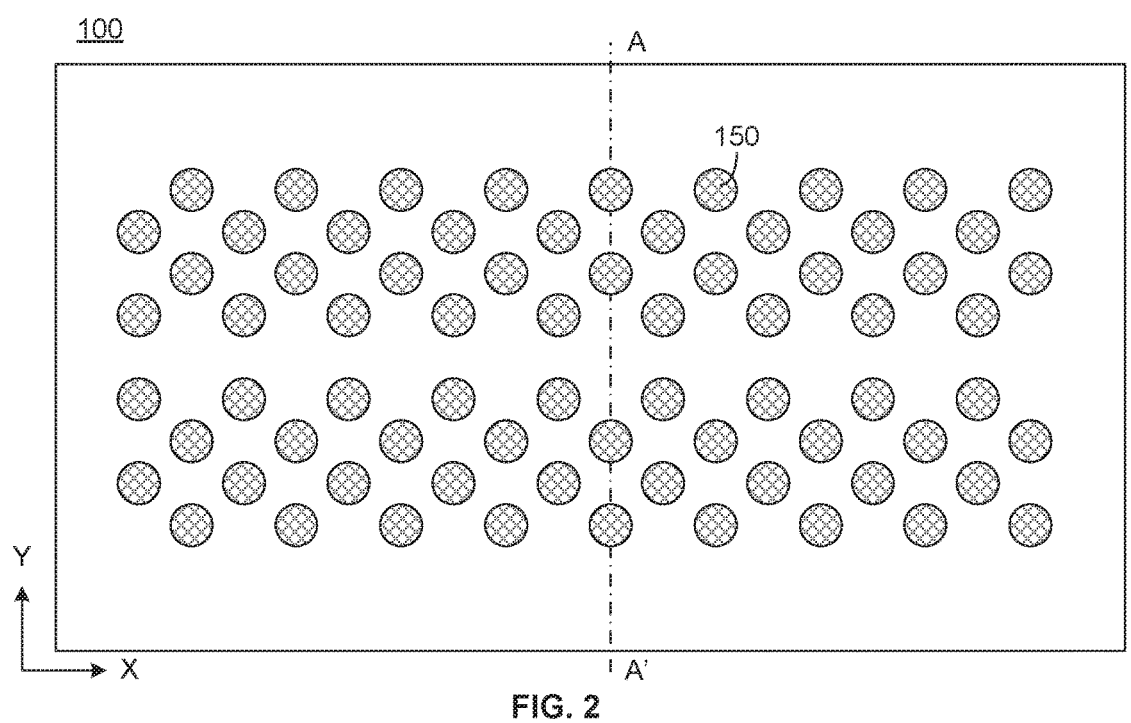
FIGS. 2 and 3 illustrate schematically a top view and a cross-sectional view of the 3D memory device shown in FIG. 1 after channel holes are formed according to embodiments of the present disclosure.
Figure 3:
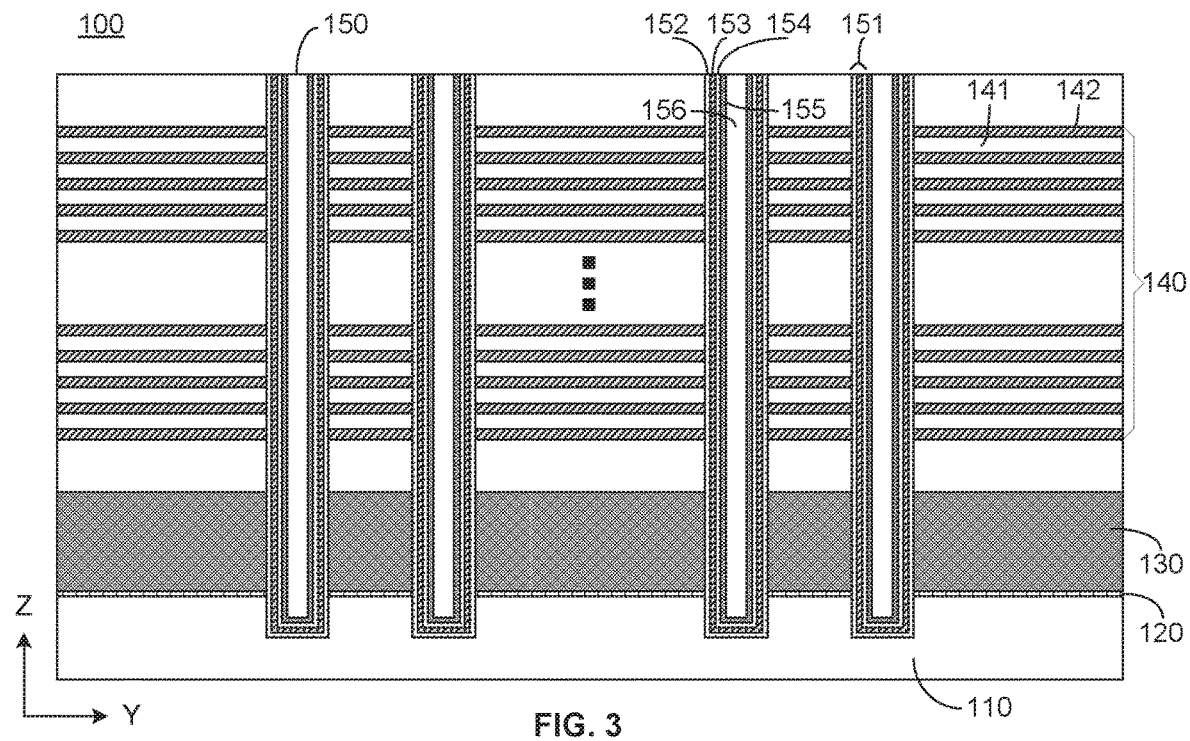

FIGS. 2 and 3 schematically show a top view and a cross-sectional view of the 3D memory device 100 after channel holes 150 are formed and then filled according to embodiments of the present disclosure. The quantity, dimensions, and arrangement of the channels hole 150 shown in the figures are only exemplary and for description of structures and fabrication methods of the device 100. The channel holes 150 are configured to extend in the Z direction and form an array of a predetermined pattern in the X-Y plane. The cross-sectional view shown in FIG. 3 is taken along a line AA' of FIG. 2. Thus, FIG. 3 only illustrates some of the channel holes 150 of FIG. 2 that are in the cross section in the Y-Z plane.

The channel holes 150 may be formed by, e.g., a dry etch process or a combination of dry and wet etch processes. Other fabrication processes may also be performed, such as a patterning process involving lithography, cleaning, and/or chemical mechanical polishing (CMP), while detailed descriptions of these processes are omitted for simplicity. The channel holes 150 may have a cylinder shape or pillar shape that extends through the layer stack ix) 140 and the layers 130 and 120, and partially penetrates the substrate 110. After the channel holes 150 are formed, a functional layer 151 may be deposited on the sidewall and bottom of the channel hole. The functional layer 151 may include a blocking layer 152 on the sidewall and bottom of the channel hole to block an outflow of charges, a charge trap layer 153 on a surface of the blocking layer 152 to store charges during an operation of the 3D memory device 100, and a tunnel insulation layer 154 on a surface of the charge trap layer 153. The blocking layer 152 may include one or more layers that may include one or more materials. The material for the blocking layer 152 may include silicon oxide, silicon nitride, silicon oxynitride, a high-k dielectric material such as aluminum oxide or hafnium oxide, another wide bandgap material, etc. The charge trap layer 153 may include one or more layers that may include one or more materials. The materials for the charge trap layer 153 may include polysilicon, silicon nitride, silicon oxynitride, nanocrystalline silicon, another wide bandgap material, etc. The tunnel insulation layer 154 may include one or more layers that may include one or more materials. The material for the tunnel insulation layer 154 may include silicon oxide, silicon nitride, silicon oxynitride, a high-k dielectric material such as aluminum oxide or hafnium oxide, another wide bandgap material, etc.

In some embodiments, the functional layer 151 may include an oxide-nitride-oxide (ONO) structure. In some other embodiments, however, the functional layer 151 may have a structure different from the ONO configuration. In descriptions below, the ONO structure is used. For example, the functional layer 151 may include a silicon oxide layer, a silicon nitride layer, and another silicon oxide layer.

As shown in FIG. 3, a silicon oxide layer may be deposited on the sidewall of the channel hole 150 as the blocking layer 152. A silicon nitride layer may be deposited on the blocking layer 152 as the charge trap layer 153. Another silicon oxide layer may be deposited on the charge trap layer 153 as the tunnel insulation layer 154. On the tunnel insulation layer 154, a polysilicon layer may be deposited as a channel layer 155, also referred to as a "semiconductor channel." In some other embodiments, the channel layer 155 (semiconductor channel) may include amorphous silicon. Like the channel holes, the channel layers 155 (semiconductor channels) also extend through the layer stack 140 and into the substrate 110. As shown in FIG. 3, a portion of each functional layer 151 is configured between a portion of one of the stack layers 141 and 142 and a portion of one of the channel layers 155. The blocking layer 152, the charge trap layer 153, the tunnel insulation layer 154, and the channel layer 155 may be deposited by, e.g., CVD, PVD, ALD, or a combination of two or more of these processes. The channel holes 150 may be filled by an oxide material 156 after the channel layers 155 are formed.

Figure 4:
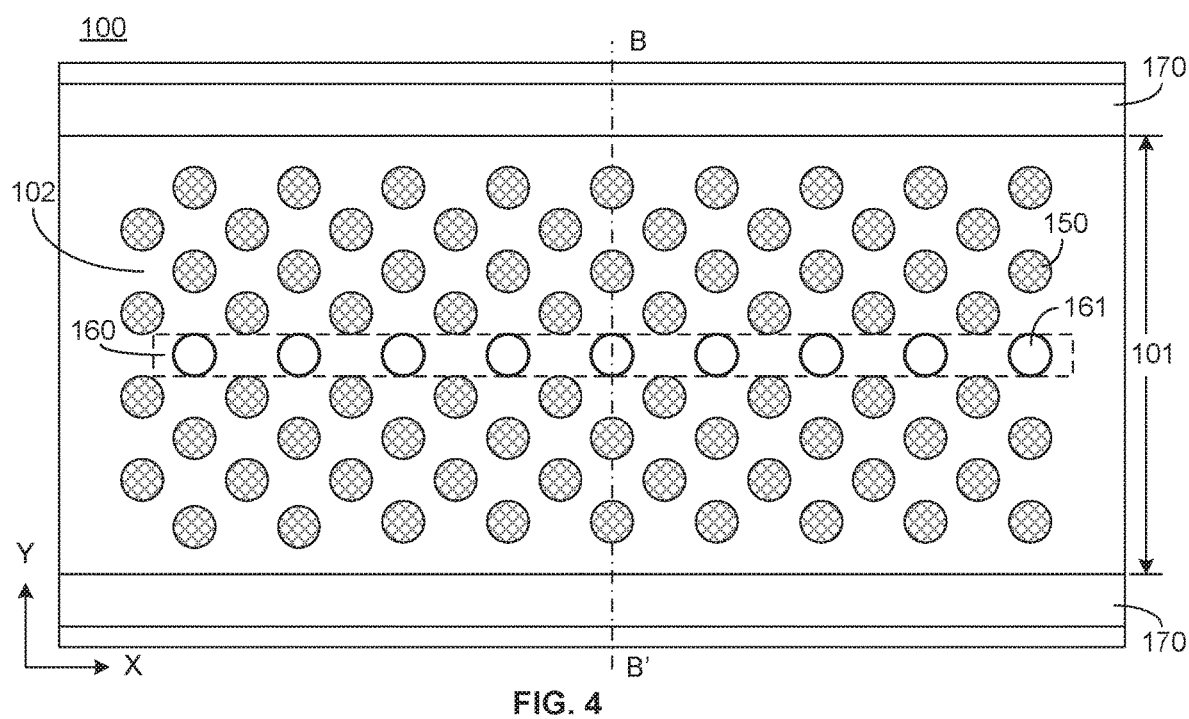
FIGS. 4 and 5 illustrate schematically a top view and a cross-sectional view of the 3D memory device shown in FIGS. 2 and 3 after gate line slits (GLS's) are formed according to embodiments of the present disclosure.
Figure 5:
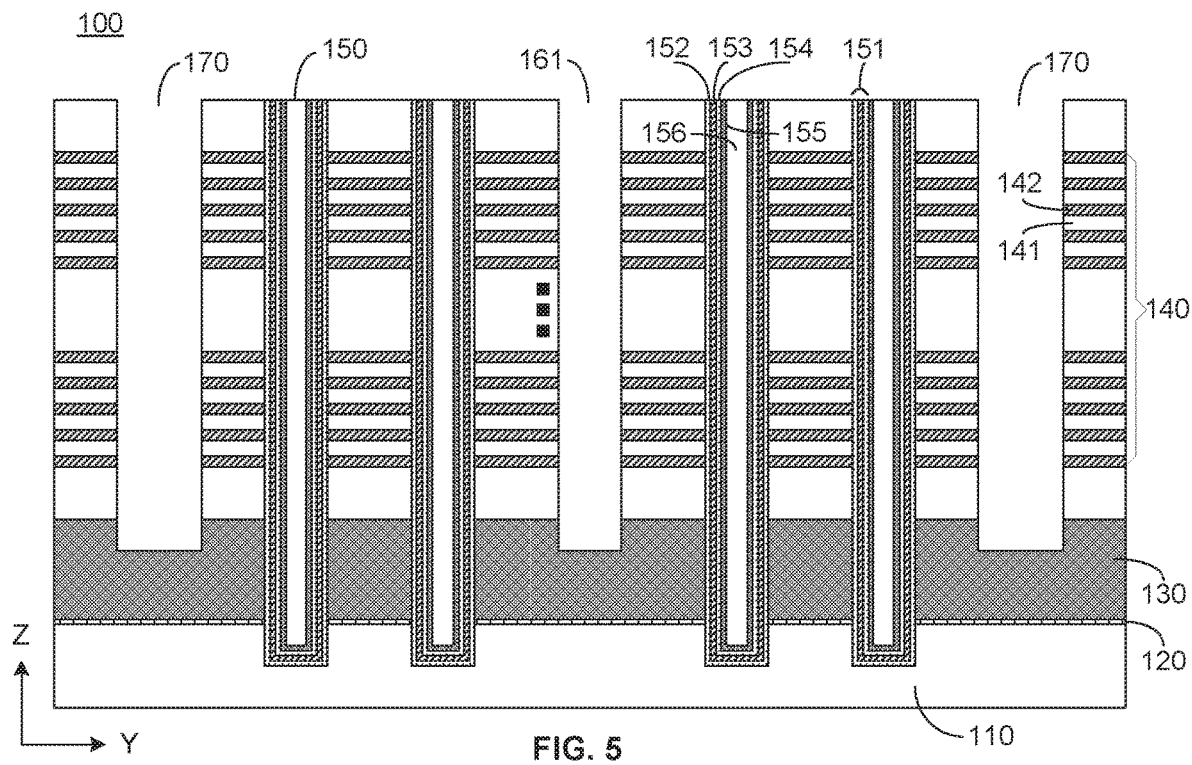

FIGS. 4 and 5 schematically show a top view and a cross-sectional view of the 3D memory device 100 after gate line slits (GLS's) are formed according to embodiments of the present disclosure. The cross-sectional view shown in FIG. 5 is taken along a line BB' of FIG. 4. The 3D memory device 100 may have a great number of NAND memory cells configured in the layer stack 140. The layer stack 140 may be divided into multiple memory blocks. In some embodiments, NAND memory cells belonging to a memory block may be reset together in a block erase operation. As shown in FIG. 4, a memory block region 101, corresponding to a memory block, may include a channel hole region 102 that may include a first gate line slit (GLS) region 160. The memory block region 101 is separated from other memory block regions (not shown) by a pair of GLS's 170 that represent second GLS regions. As shown in FIG. 4, the memory block region 101 is configured between the pair of the GLS's 170 in the Y direction.

The first GLS region 160 may include multiple GLS's 161 in a middle part of the channel hole region 102 between the GLS's 170. In some embodiments, the GLS's 161 may have the same shape as and similar dimensions to that of the channel hole 150. In some embodiments, the GLS's 161 may have a different shape and/or different dimensions than that of the channel hole 150. The GLS's 161 may, e.g., have a circular shape, a square shape, a diamond shape, an oval shape, etc. The first GLS region 160 may include a certain number of GLS's 161 and in some embodiments may extend along the X direction. In some other embodiments, the first GLS region 160 may extend along both the X and Y directions. The GLS's 161 in the first GLS region 160 are configured noncontinuous and spaced apart from each other along the X direction. That is, adjacent GLS's 161 are separated from each other and the spacing between two adjacent GLS's 161 may be at least larger than a predetermined value. As the GLS 170 extends continuously along the X direction, the arrangement of the GLS's 161 may be viewed as extending and being spaced apart along a direction parallel to the GLS's 170. In some embodiments, the spacing between two adjacent GLS's 161 may be a fixed value. In some other embodiments, the spacing between two adjacent GLS's 161 may have different values. The spacing between adjacent GLS's 161 is configured such that the gate electrodes of each NAND memory cell in the memory block region 101 are electrically connected. As such, the first GLS region 160 or the GLS's 161 split the channel hole region 102 into two electrically connected portions, and the functionality of the memory block region 101 is not affected by the GLS's 161.

Compared to the noncontinuous GLS 161, the GLS 170 is continuous in the X direction. As shown in FIG. 4, the pair of the GLS's 170 are parallel to each other and each continuously extend in the X direction from the left side to the right side of the channel hole region 102. The pair of GLS's 170, which represent the second GLS regions, may be viewed as two boundary regions of the memory block region 101. Thus, multiple pairs of GLS's 170 may divide the NAND memory cells of the device 100 into multiple memory block regions (not shown).

The GLS's 161 and 170 may be formed by, e.g., a dry etch process or a combination of dry and wet etch processes. As shown in FIG. 5, the GLS's 161 and 170 each extend through the layer stack 140 and reach or partially penetrate the polysilicon layer 130 in the Z direction. As such, at the bottom of the GLS's 161 and 170, parts of the polysilicon layer 130 are exposed. Because of the GLS's 161, more parts or a larger total area of the layer 130 is exposed compared to scenarios where the GLS's 161 don't exist. Hence, it becomes faster and easier to etch out the layer 130 to form a cavity, and it also becomes faster and easier to grow epitaxial layers in the cavity. In addition, because of the GLS's 161, more parts or a larger total area of the stack layers 142 is exposed. Similarly, it becomes faster and easier to etch out the layers 142 to form cavities and faster and easier to fill the cavities with a conductive material.

Figure 6:
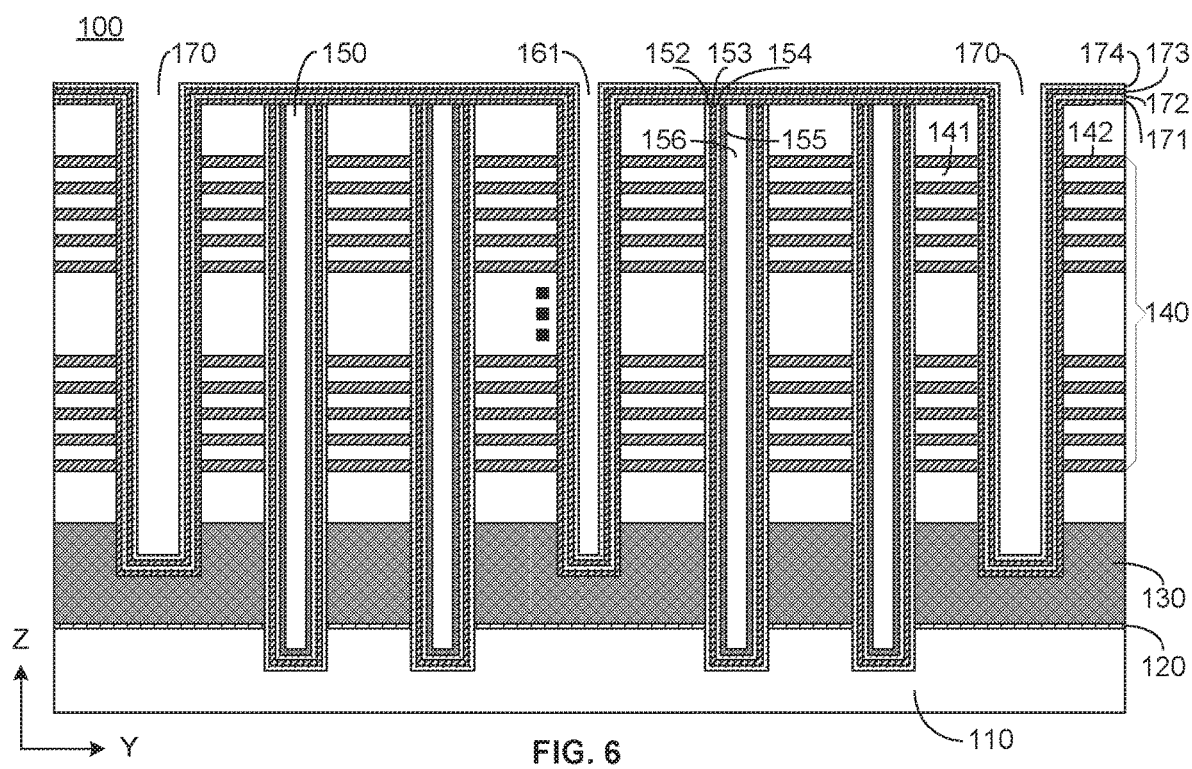
FIGS. 6 and 7 illustrate schematically cross-sectional views of the 3D memory device shown in FIGS. 4 and 5 after GLS spacers are deposited and then etched selectively according to embodiments of the present disclosure.
Figure 7:
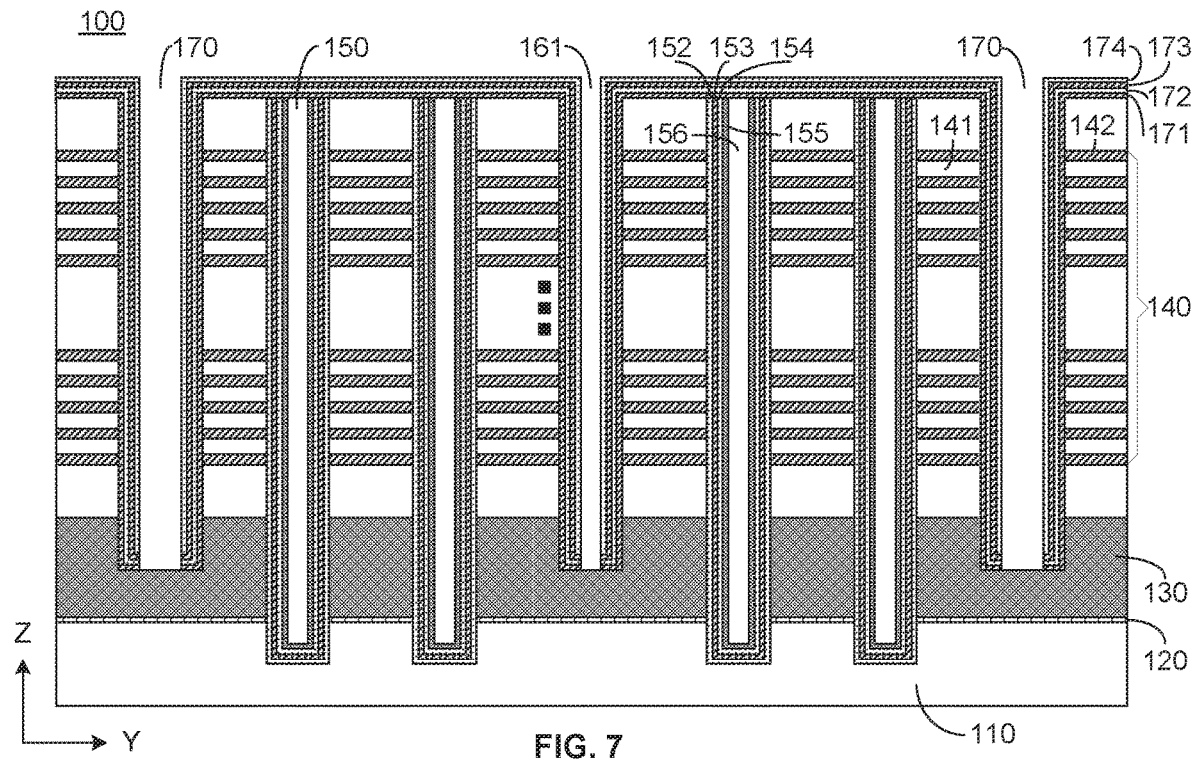

FIGS. 6 and 7 schematically show cross-sectional views of the 3D memory device 100 after GLS spacers are deposited and then selectively etched according to embodiments of the present disclosure. As shown in FIGS. 6 and 7, the GLS spacers include layers 171, 172, 173, and 174 that may be deposited sequentially by CVD, PVD, ALD, or a combination of two or more of these processes. The layers 171 and 173 may include, for example, silicon nitride and the layers 172 and 174 may include, for example, silicon oxide. After the GLS spacers are deposited, selective etching is performed such that parts of the spacers at the bottom of the GLS's 161 and 170 are removed by dry etch or a combination of dry etch and wet etch. As such, the polysilicon layer 130 is partially exposed at the bottom of the GLS's 161 and 170, as shown in FIG. 7.

Figure 8:
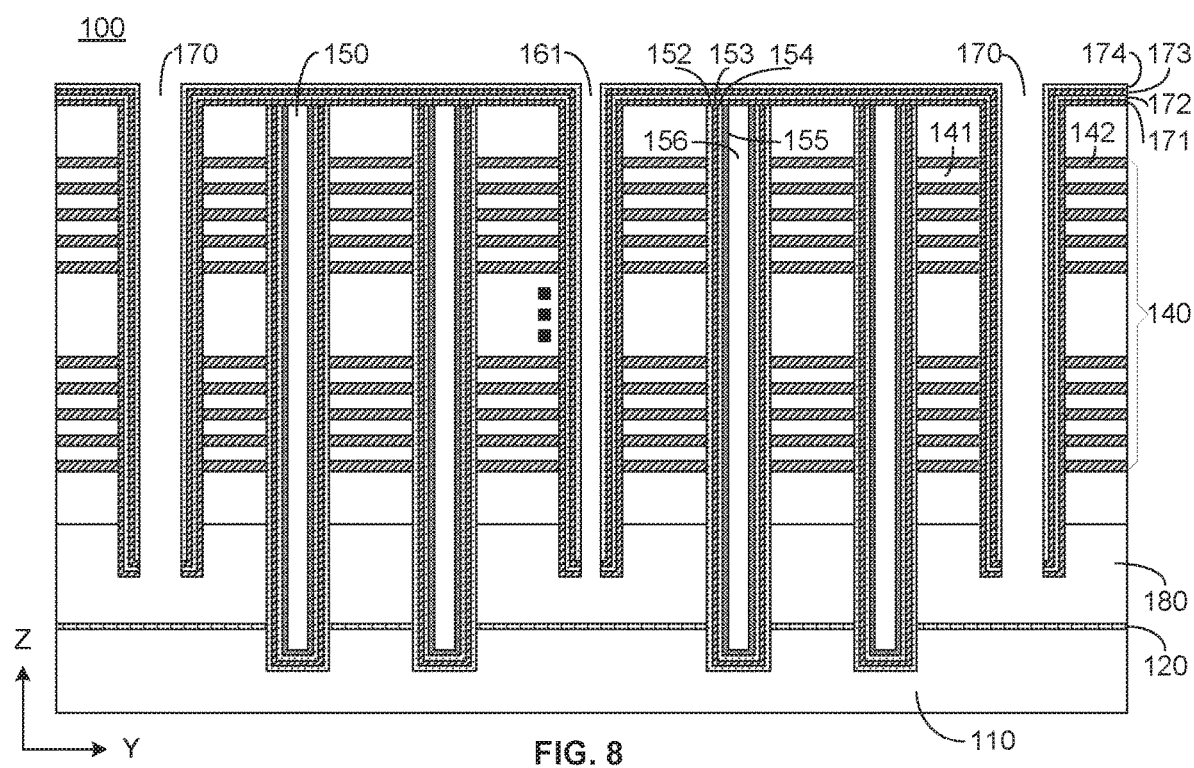
FIGS. 8 and 9 illustrate schematically cross-sectional views of the 3D memory device shown in FIG. 7 after certain etching steps are performed according to embodiments of the present disclosure.

FIGS. 8-12 each schematically show a cross-sectional view of the 3D memory device 100 after one or more etching steps are performed according to embodiments of the present disclosure. A first selective etch process, e.g., a selective wet etch process, is performed to remove polysilicon materials of the polysilicon layer 130. As illustrated in FIG. 8, removal of the polysilicon materials creates a cavity 180, exposing the cover layer 120 and bottom portions of the silicon oxide layers (i.e., the blocking layers 152) of the above-described functional layers 151 formed in the channel holes 150.

After the polysilicon layer 130 is etched, a second selective etch process, e.g., a selective wet etch process, is performed to remove parts of the silicon oxide layer of the functional layer 151 that are exposed in the cavity 180. As a result, portions of the silicon nitride layers (i.e., the charge trap layers 153) of the functional layers 151 are exposed. Since the layer 174 of GLS spacers is silicon oxide, the layer 174 is also removed in the second selective etch process. Then, the silicon nitride layer 173 is exposed.

After the portions of the silicon nitride layers 153 and the layer 173 are exposed, a third selective etch process, e.g., a selective wet etch process, is performed to remove exposed silicon nitride materials, including the exposed portions of the silicon nitride charge trap layers 153, and the layer 173. Removal of the silicon nitride materials exposes portions of the silicon oxide layer (i.e., the tunnel insulation layer 154) of the functional layer 151 in the cavity 180, and the silicon oxide layer 172 of the GLS spacers.

Then, a fourth selective etch process, e.g., a selective wet etch process is performed to remove the exposed portions of the silicon oxide tunnel insulation layer 154. In some embodiments, the silicon oxide layer 172 may be configured sufficiently thicker than the layer 154. As such, only a part of the layer 172 may be removed after the layer 154 is etched away in the fourth selective etch. The remaining part of the layer 172 may form a layer 1721. Removal of the tunnel insulation layer 154 exposes portions of the polysilicon layer (i.e., the channel layer 155) in the cavity 180.

In some embodiments, the cover layer 120 may be silicon oxide. Then, the layer 120 may be removed when the bottom portions of the functional layer 151 are etched away. In some other embodiments, the cover layer 120 may include a material other than silicon oxide or may be the composite layer. Then, the layer 120 may be removed by a fifth selective etch process.

Figure 9:
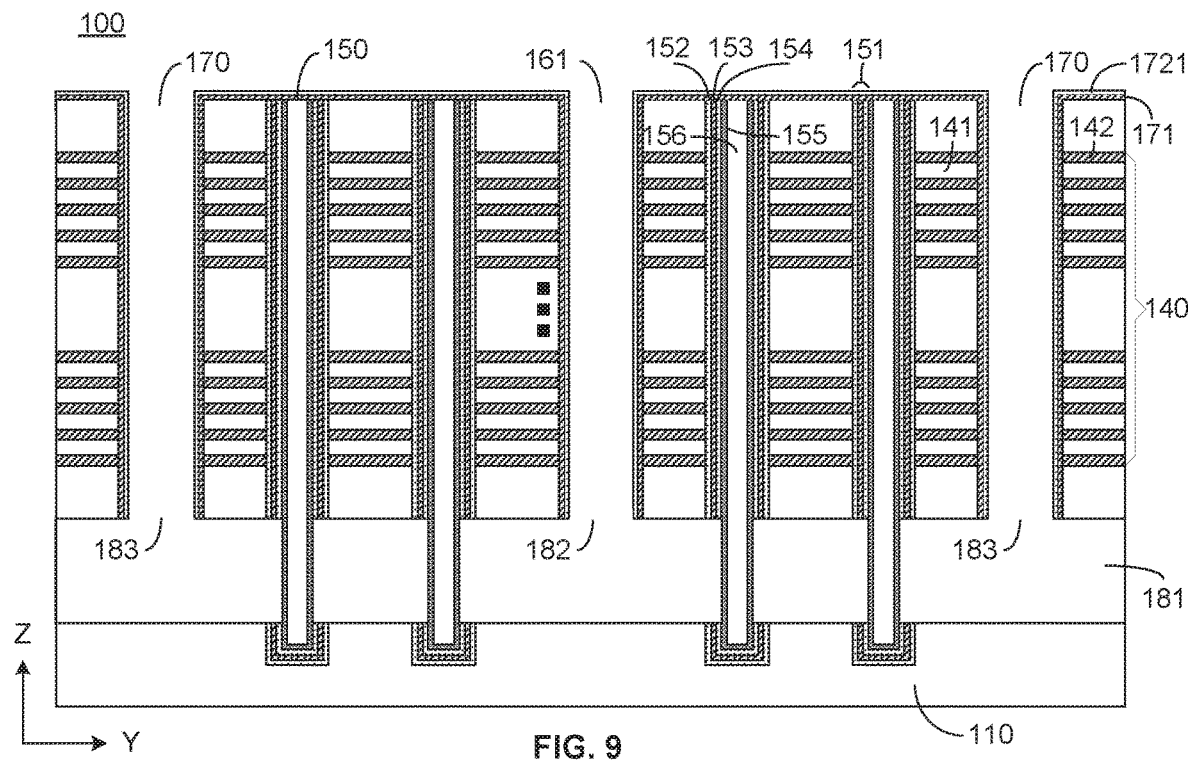

Removal of the cover layer 120 creates a cavity 181 and exposes the top surface of the substrate 110 at the bottom of the cavity 181, as shown in FIG. 9. The cavity 181 is larger than the cavity 180 and has openings 182 and 183. The openings 182 and 183 correspond to GLS's 161 and 170, respectively. If the openings 182 don't exist, the cavity 181 would have only two openings, i.e., the openings 183 on the left and right sides. Then, some portion of the substrate and some exposed portions of the channel layers 155 (i.e., the sidewalls of the cavity 181) in the middle may be away from the openings 183 by a distance that is about half of the distance between the openings 183. The farther it is away from the openings 183, the slower the selective epitaxial growth of silicon. Then, silicon layers may grow faster on some portions of the substrate 110 that are opposite to openings 183 than on some other portions of the substrate and some sidewalls that are farther away from the openings 183. Then, the silicon deposited on the substrate 110 may approach and seal the openings 183 before voids are filled around the middle region between the openings 183. That is, voids may form around some of the channel holes 150, especially those in the middle between the openings 183. Because of the GLS 161, the opening 182 is created around the middle region between the openings 183. As such, silicon layers may grow faster around the middle region, and then silicon layers may grow more evenly in the cavity 181 and the voids may be prevented.

As shown in FIG. 9, after the above described etch process, the substrate 110 and portions of the polysilicon channel layers 155 close to the bottom of the channel holes 150 are exposed. The layer 1721 is also in an exposed condition. The layers 1721 and 171 may be used to protect the layer stack 140 before the stack layers 142 are etched and replaced.

Figure 10:
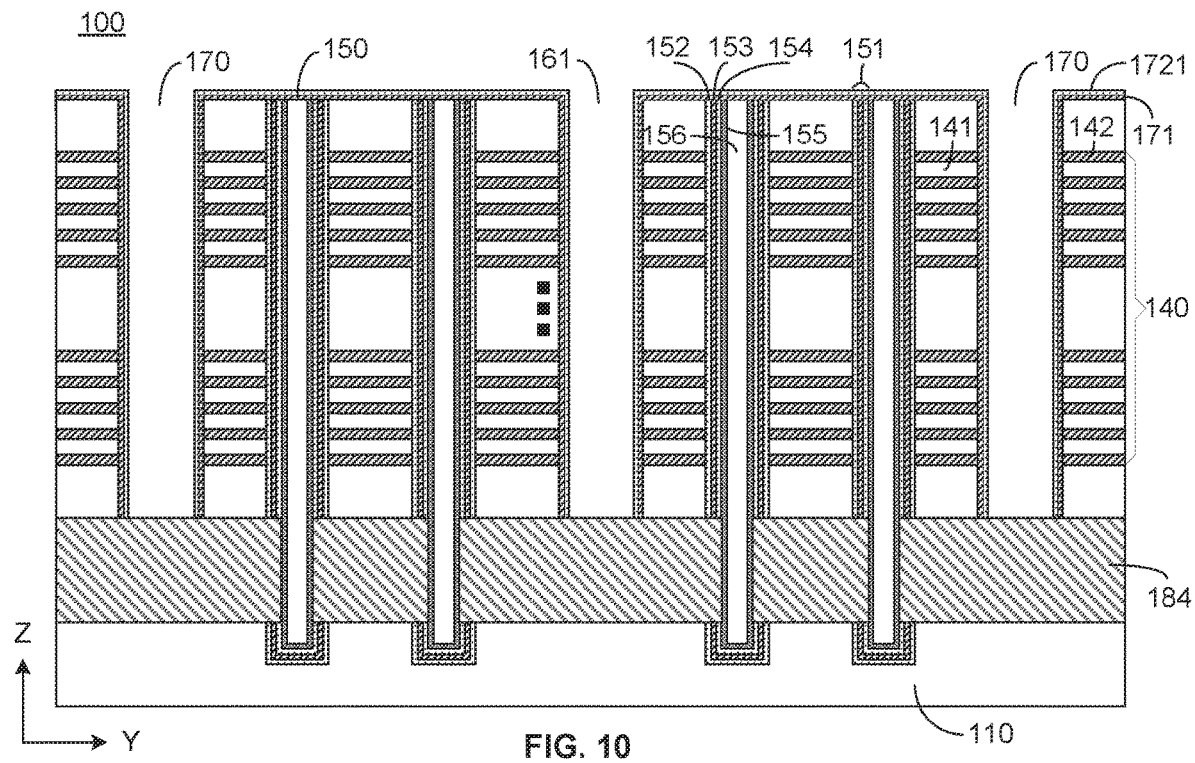
FIG. 10 illustrates schematically a cross-sectional view of the 3D memory device shown in FIG. 9 after a selective epitaxial growth according to embodiments of the present disclosure.

FIG. 10 schematically shows a cross-sectional view of the 3D memory device 100 after a selective epitaxial growth according to embodiments of the present disclosure. The selective epitaxial growth is performed to deposit a silicon layer 184 in the cavity 181. As the substrate 110 is single crystalline silicon and the exposed portions of the channel layers 155 (the side walls) are polysilicon, a single crystalline silicon layer is grown on the substrate, and a polysilicon layer is grown on the sidewalls of the cavity 181. The single crystalline silicon layer and polysilicon layer grow simultaneously and adjoin or merge with each other to form the layer 184, as shown in FIG. 10. In some embodiments, the layer 184 may be doped with p-type dopants.

Because the GLS 161 provides the opening 182 in the middle between the GLS's 170, the top surface of the substrate 110 and the sidewalls of the cavity 181, including those in the middle, are within a certain distance from at least one of the opening 182 or 183. Thus, the cavity 181 may be filled with the layer 184 without voids. As aforementioned, if the GLS 161 does not exist, the silicon layer in the middle between the openings 183 may grow slower and then voids may form above some portions of the substrate 110. The voids may cause leakage of the electrical current and functional and reliability issues.

Figure 11:
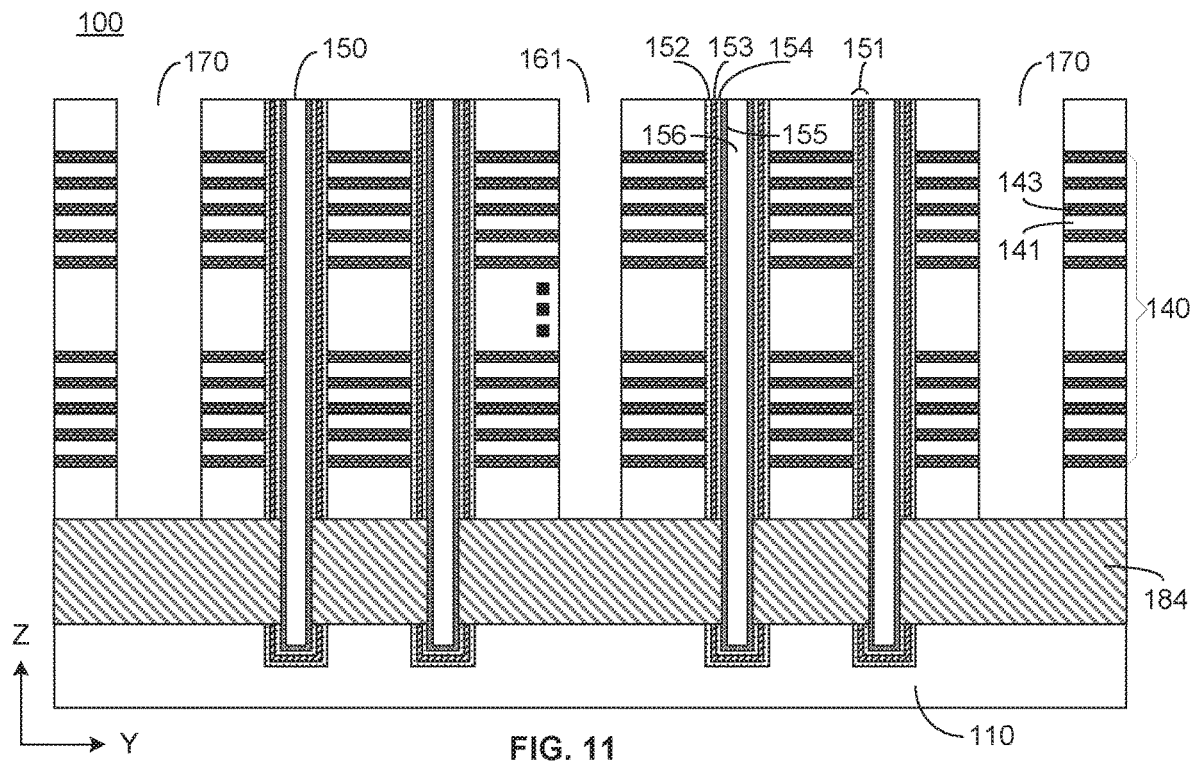
FIG. 11 illustrates schematically a cross-sectional view of the 3D memory device shown in FIG. 10 after conductor layers are formed according to embodiments of the present disclosure.

FIG. 11 schematically shows a cross-sectional view of the 3D memory device 100 after additional fabrication steps are performed according to embodiments of the present disclosure. Following the selective epitaxial growth, etch processes, such as selective wet etch processes, may be performed to remove the silicon oxide layer 1721 and the silicon nitride layer 171. Because the layers 142 of the layer stack 140 are also silicon nitride layers, the silicon nitride layers 142 are removed during the etch processes, leaving cavities between the silicon oxide layers 141. Then, an electrically conductive material such as W is grown to fill the cavities left by the removal of the layers 142, forming conductor layers 143 between the silicon oxide layers 141. That is, the conductor layers 143 replace the dielectric layers 142 and the layer stack 140 now includes alternating dielectric layers 141 and conductor layers 143, as shown in FIG. 11. The conductor layers 143 can be parallel to the substrate 110 and a portion of each functional layer 151 in a channel hole 150 is between a portion of one of the conductor layers 143 and a portion of the channel layer 155 in the channel hole 150. The conductive material may be deposited by CVD, PVD, ALD, or a combination of two or more of these processes. In some embodiments, another metal, such as Co, Cu, or Al, may be used as the conductive material for forming the conductor layers 143.

Each conductor layer 143 is configured to electrically connect one or more rows of NAND memory cells along the Y direction or in the X-Y plane and is configured as a word line for the 3D memory device 100. The channel layer 155 formed in the channel hole 150 is configured to electrically connect a column or a string of NAND memory cells along the Z direction and is configured as a bit line for the 3D memory device 100. As such, a portion of the functional layer 151 in the channel hole 150 in the X-Y plane, as a part of a NAND memory cell, is arranged between a conductor layer 143 and a channel layer 155, i.e., between a word line and a bit line. A portion of the conductor layer 143 that is around a portion of the channel hole 150 functions as a control gate or gate electrode for a NAND memory cell. The 3D memory device 100 as depicted in FIG. 11 can be considered as including a 2D array of strings of NAND cells (such a string is also referred to as a "NAND string"). Each NAND string contains multiple NAND cells and extends vertically toward the substrate 110. The NAND strings form a 3D arrangement of the NAND memory cells.

When the sacrificial layers 142 are etched and the conductor layers 143 are deposited, the GLS 161 plays an important role. The spacing between adjacent layers 141 is relatively narrow and the distance between the GLS's 170 is relatively long. If the GLS 161 doesn't exist, etching the layer 142 has to go through the narrow and long spacing between the layers 141. Then, some portions of the layer 142 that is in the middle region horizontally may not be etched out completely. If some portions of the layer 142 are not etched out, some portions of the conductor layer 143 may not be deposited or deposited properly. As the conductor layer 143 functions as the gate electrode for the NAND memory cell, an incomplete gate electrode can lead to the failure of a NAND memory cell. Because the GLS 161 is configured around the middle region between the GLS's 170, the length of the narrow and long spacing between the layers 141 is cut by half. As such, the layers 142 may be etched away completely and the conductor layers 143 or the gate electrodes may be deposited properly.

After the conductor layers 143 are formed, first array common sources (ACS's) 190 and second ACS's 191 may be fabricated. First, a silicon oxide layer 192, as an electrical insulation layer, may be deposited on the sidewalls and bottom surfaces of the GLS's 161 and 170 by CVD, PVD, ALD, or a combination of two or more of these processes. Then, a dry etch process or a combination of dry etch and wet etch processes may be performed, which removes portions of the layer 192 at the bottom of the GLS's 161 and 170 to expose parts of the layer 184.

Figure 12:
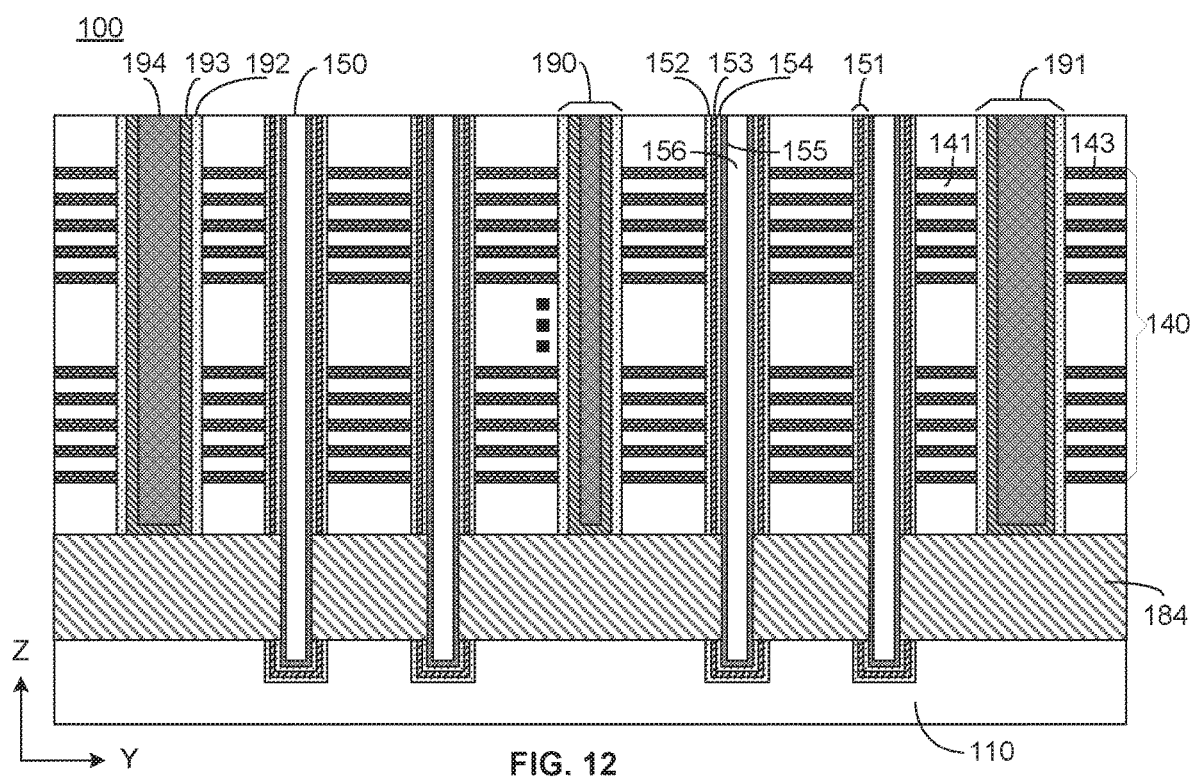
FIG. 12 illustrates schematically a cross-sectional view of the 3D memory device shown in FIG. 11 after the array common sources (ACS's) are formed according to embodiments of the present disclosure.

Then, other processes are performed to form the first ACS's 190 and second ACS's 191 in the GLS's 161 and 170. For example, a conductive layer 193 including a conductive material such as titanium nitride, W, Co, Cu, Al, doped silicon, or silicide may be deposited on the silicon oxide layer 192 and electrically contact the layer 184 at the bottom of the GLS's 161 and 170. The GLS's 161 and 170 may then be filled with a conductive material 194 such as doped polysilicon. That is, in some embodiments, the first ACS's 190 and second ACS's 191 each may include an isolation layer deposited on a sidewall of GLS, a conductive material deposited on the isolation layer, and a conductive material filling the GLS. The isolation layer insulates the first ACS's 190 and second ACS's 191 from the conductor layers 143. In some embodiments, the first ACS's 190 and second ACS's 191 each may include an isolation layer deposited on a sidewall of GLS and one or more conductive materials that are deposited on the isolation layer and fill the GLS. As shown in FIG. 12, after the first ACS's 190 and second ACS's 191 are formed, they become electrically conductive channels, extending through the layer stack 140 and electrically contacting the layer 184.

As the first ACS's 190 are formed by filling the GLS's 161 in the first GLS region 160, the first ACS's 190 may also have a cylinder or pillar shape. Similarly, the second ACS's 191 may have the same shape as or a similar shape to that of the GLS 170. As such, the arrangement of the first ACS 190 is the same as that of the GLS 161 and the arrangement of the second ACS 191 is the same as that of the GLS 170. That is, the first ACS's 190 extend in a noncontinuous manner and are spaced apart along the X direction, and the second ACS's 191 extend from the left side to the right side of the memory block region 101 in a continuous manner along the X direction. The first ACS's 190 are in the middle part of the region 101 between the second ACS's 191 and spaced apart along a direction parallel to the second ACS's 191. Further, the second ACS's 191 divide the NAND memory cells into multiple memory block regions (not shown). Each memory block region may be arranged between a pair of the second ACS's 191 in the Y direction, and include a channel hole region that includes the noncontinuous first ACS's 190. In some other embodiments, the first ACS's 190 may extend in a noncontinuous manner along the X direction and the Y direction. When the first ACS's extend along both X direction and the Y direction, a corresponding fabrication process may remain the same as that when the first ACS's extend only along the X direction.

After the first and second ACS's are formed, other fabrication steps or processes are performed to complete fabrication of the device 100. Details of the other fabrication steps or processes are omitted for simplicity.

Figure 13:
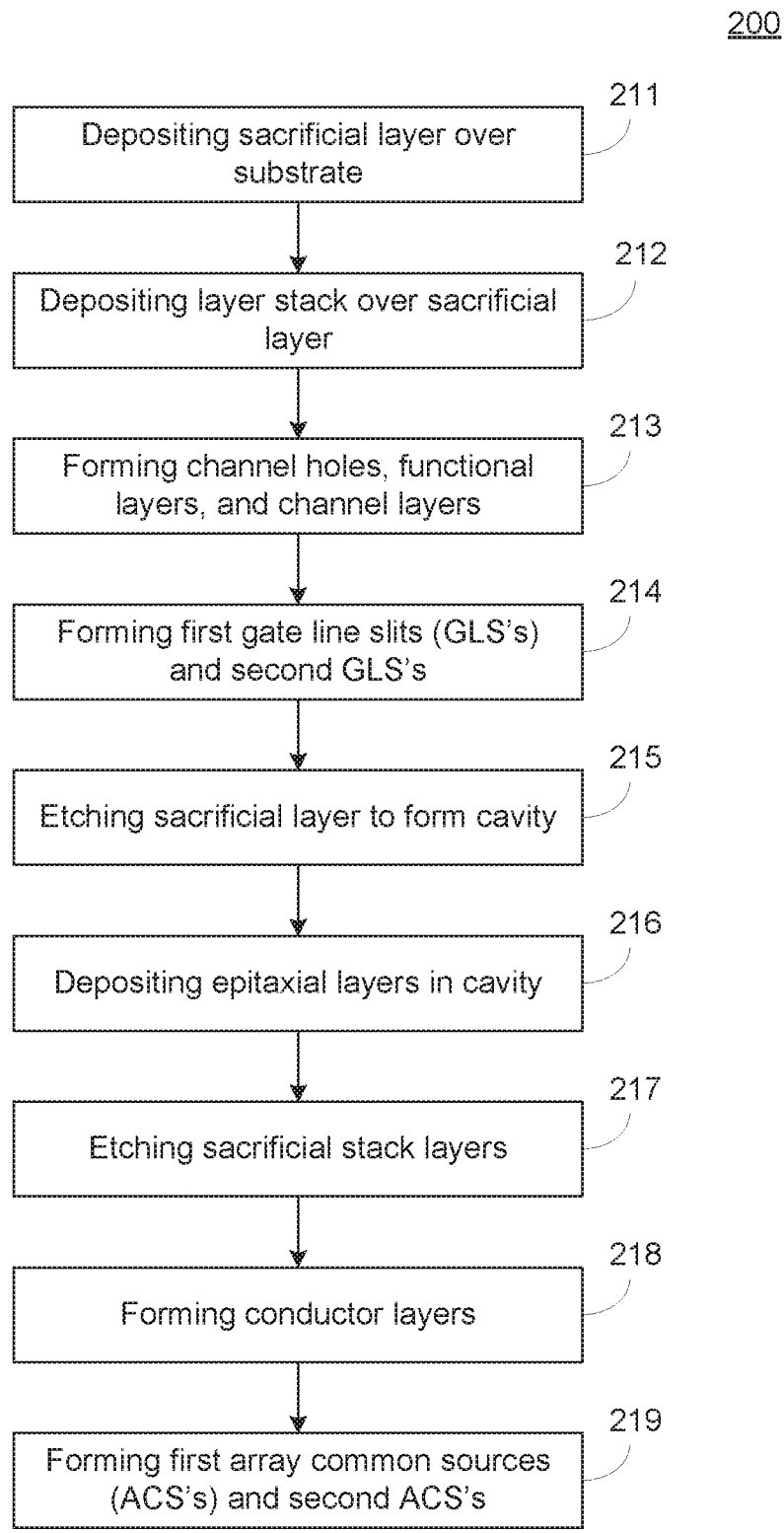
FIG. 13 illustrates a schematic flow chart of fabrication of a 3D memory device according to embodiments of the present disclosure.

FIG. 13 shows a schematic flow chart 200 for fabricating a 3D memory device according to embodiments of the present disclosure. At 211, a sacrificial layer may be deposited over a top surface of a substrate. The substrate can include a semiconductor substrate, such as a single crystalline silicon substrate. In some embodiments, a base layer or cover layer may be deposited on the substrate before depositing the sacrificial layer. The base layer or cover layer may include a single layer or a composite layer including multiple layers deposited sequentially over the substrate. In some embodiments, the base or cover layer may include silicon oxide, silicon nitride, and/or aluminum oxide. In some other embodiments, the sacrificial layer may be deposited without first depositing the base or cover layer over the substrate. The sacrificial layer may include single crystalline silicon, polysilicon, silicon oxide, or silicon nitride.

At 212, a layer stack may be deposited above the sacrificial layer. The layer stack includes a first stack layer and a second stack layer that are alternately stacked. In some embodiments, the first stack layer may include a first dielectric layer and the second stack layer may include a second dielectric layer that is different than the first dielectric layer. In some embodiments, one of the first and second dielectric layers is configured as a sacrificial stack layer. In some other embodiments, the first and second stack layers may include a dielectric layer and an electrically conductive layer, respectively.

At 213, channel holes may be formed through the layer stack and the sacrificial layer to expose portions of the substrate. A functional layer and a channel layer may be deposited on the sidewall of each channel hole. Forming the functional layer may include depositing a blocking layer on the sidewall of the channel hole, depositing a charge trap layer on the blocking layer, and depositing a tunnel insulation layer on the charge trap layer. The channel layer, deposited on the tunnel insulation layer, functions as a semiconductor channel and may include a polysilicon layer.

At 214, the first GLS's and second GLS's may be formed that extend vertically through the layer stack and into the sacrificial layer, and expose portions of the sacrificial layer. The second GLS's also extend continuously along a horizontal direction and divide the NAND memory cells into multiple memory block regions. The memory block region includes a channel hole region that includes the first GLS's. The first GLS's may be noncontinuous along the horizontal direction and spaced apart by one or more predetermined distance values. Since the first GLS's are noncontinuous, the first GLS's don't affect the functionality of the memory block region.

At 215, the sacrificial layer may be etched away and a cavity may be created above the substrate. The cavity exposes a portion of the blocking layer of the functional layer in the cavity. The base or cover layer is also exposed in the cavity, if it is deposited on the substrate. Then, the layers of the functional layer exposed sequentially in the cavity, including the blocking layer, the charge trap layer, and the tunnel insulation layer, are etched away by, e.g., one or more selective etch processes, respectively. As a result, a portion of the functional layer that is close to the substrate may be removed in the cavity. The base or cover layer, if deposited, also may be etched away during the process to etch the portion of the functional layer or in another selective etch process. Hence, a potion of the substrate and side portions of the channel layers are exposed in the cavity.

At 216, a selective epitaxial growth may be performed to grow a single crystalline silicon layer on the substrate and polysilicon epitaxial layers on the exposed portions of the channel layers (i.e., the sidewalls) in the cavity. The single crystalline silicon layer and polysilicon layers adjoin or merger with each other to fill the cavity during the epitaxial growth. Because the first GLS's are arranged in the channel hole region, the epitaxial growth rate of single crystalline silicon and polysilicon is more even in the cavity compared to that when the first GLS's don't exist. As such, void formation is prevented when the cavity is filled.

In some embodiments, the layer stack includes two dielectric stack layers and one of the stack layers is sacrificial. The sacrificial stack layers may be etched away at 217 to leave cavities, which then may be filled with an electrically conductive material to form conductor layers at 218. The electrically conductive material may include a metal such as W, Co, Cu, or Al. Because the first GLS's are arranged in the middle of the channel hole region, the sacrificial stack layers may be etched completely. Hence, formation of incomplete gate electrode may be avoided.

At 219, an oxide layer may be deposited and etched selectively at the first and second GLS's to expose the epitaxial layer that filled the cavity. Electrically conductive materials, such as titanium nitride, W, Cu, Al, and/or doped polysilicon may be deposited in the GLS's to form the first and second ACS's that electrically contact the epitaxial layer, respectively.

Figure 14:
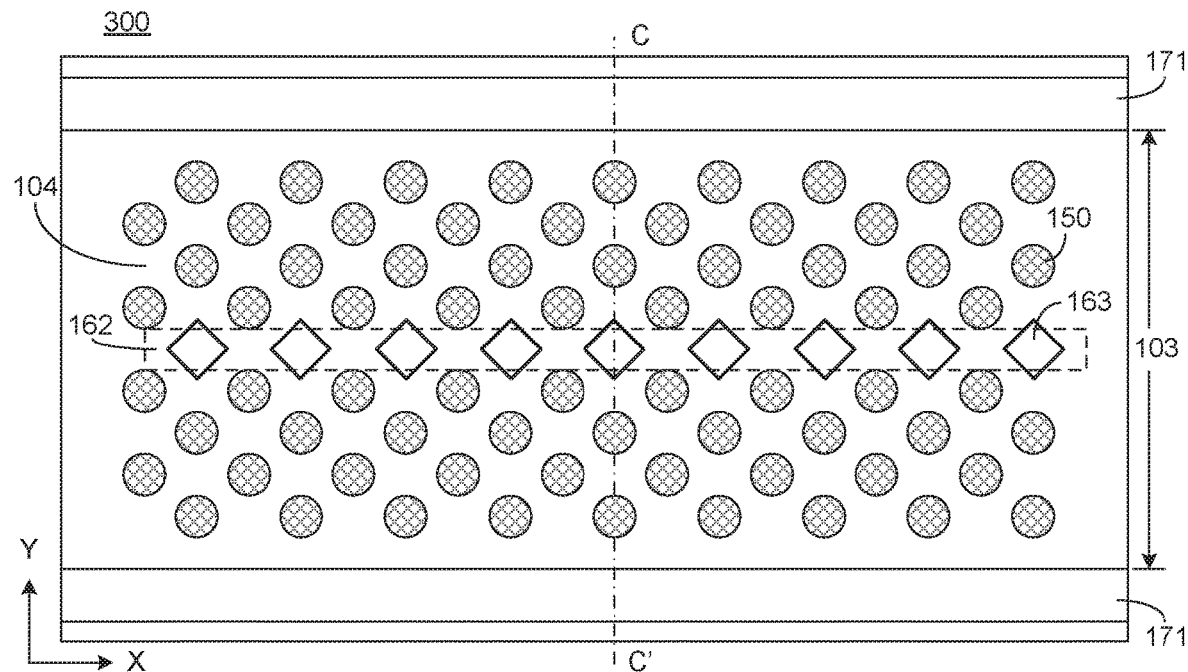
FIGS. 14 and 15 illustrate schematically a top view and a cross-sectional view of another 3D memory device after GLS's are formed according to embodiments of the present disclosure.
Figure 15:
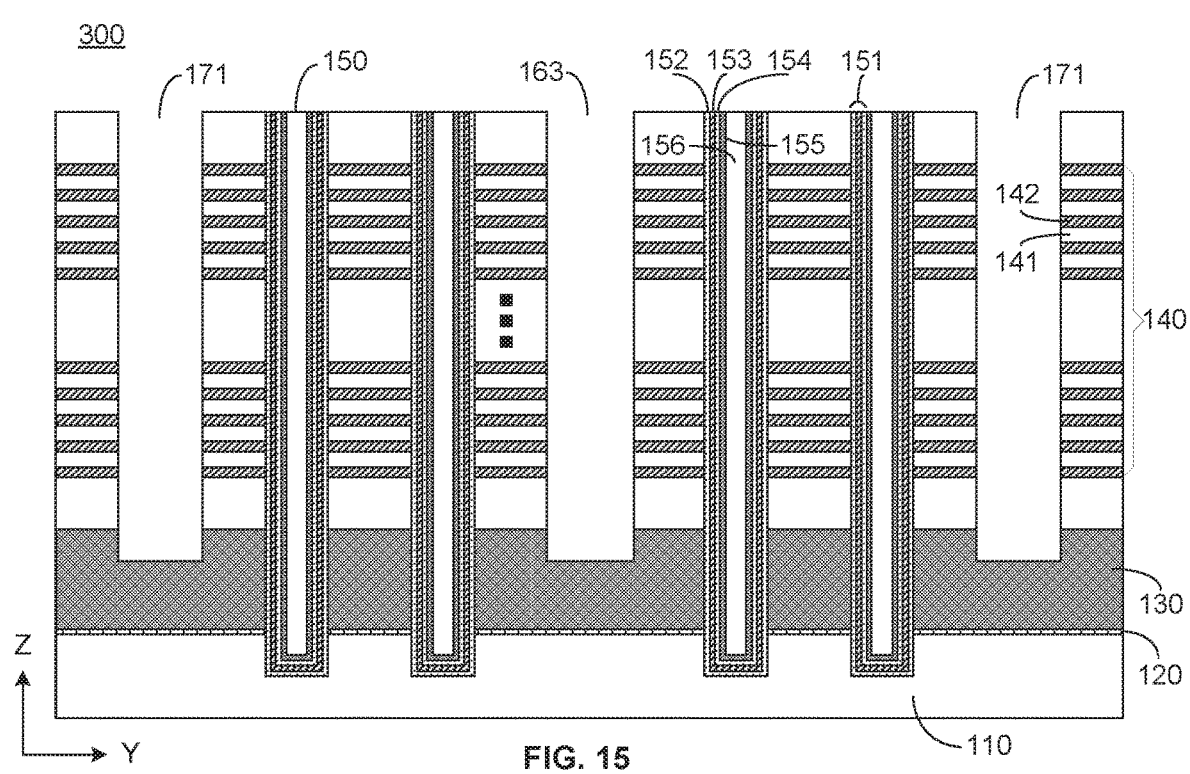

FIGS. 14 and 15 schematically show a top view and a cross-sectional view of another 3D memory device 300 according to embodiments of the present disclosure. The cross-sectional view shown in FIG. 15 is taken along a line CC' of FIG. 14. The structure of the 3D memory device 300 can be similar to that of the device 100, but a first GLS region 162 of the device 300 is different than the first GLS region 160 of the device 100.

As shown in FIGS. 14 and 15, the channel holes 150 of the device 300 are configured to extend in the Z direction and form an array of certain pattern in the X-Y plane. NAND memory cells of the 3D memory device 300 may be divided into multiple memory block regions (not shown) by GLS's 171. The GLS's 171 may have the same structure as or a similar structure to that of the GLS 170 of the device 100. A memory block region 103, separated from other memory block regions (not shown), may include a channel hole region 104. The memory block region 103 may be configured between the pair of the GLS's 171. The channel hole region 104 may include the first GLS region 162 that includes multiple GLS's 163. The GLS's 163 extend noncontinuously and are spaced apart from each other along the X direction, while the GLS's 171 extend continuously in the X direction. In contrast to the GSL 161 of the device 100 that has a circular cross-section in the X-Y plane, the GLS 163 has a diamond-shaped cross-section in the X-Y plane. In some embodiments, as in FIG. 14, the GLS's 163 may have the same shape and dimensions in the channel hole region 104. In some other embodiments, the GLS's 163 may have different shapes and/or different dimensions in the channel hole region 104.

The fabrication method for the 3D NAND memory device 300 may use one or more processes that are the same as or similar to those used for the device 100. For example, one or more deposition processes, one or more etch processes, and/or one or more filling processes used for the device 100 may be used in the fabrication of the device 300.

For example, as shown in FIGS. 14 and 15, when the 3D memory device 300 is fabricated, the layer 120 may be deposited over a top surface of the substrate 110 by CVD, PVD, ALD, or a combination of two or more of these processes. Next, similar to the device 100, a sacrificial layer, such as the polysilicon layer 130, and the layer stack 140 including alternating stack layers 141 and 142 may be deposited sequentially over the layer 120. Similar to the device 100, the stack layers 141 and 142 of the device 300 also may exemplarily include silicon oxide and silicon nitride, respectively. As shown in FIG. 15, similar to the device 100, the device 300 also may include the channel holes 150, the functional layers 151, and the polysilicon channel layers 155 (semiconductor channels). The functional layers 151 are formed on the sidewalls and bottom surfaces of the channel holes 150 in the same way as that for the device 100. The functional layer 151 may exemplarily include a silicon oxide layer as the blocking layer 152 deposited on the sidewall and bottom of the channel hole 150, a silicon nitride layer as the charge trap layer 153 deposited on a surface of the blocking layer 152, and a silicon oxide layer as the tunnel insulation layer 154 deposited on a surface of the charge trap layer 153. The polysilicon channel layer 155 may be deposited on a surface of the tunnel insulation layer 154. The channel holes 150 may be filled with the dielectric material 156.

Next, the GLS's 163 and 171 may be formed. As shown in FIG. 14, the cross-section of the GLS 163 has a diamond shape in the X-Y plane. Similar to the device 100, the GLS spacers may be deposited and selectively etched to expose the sacrificial layer 130. Next, the sacrificial layer 130, the layer 120, and a portion of the functional later 151 close to the substrate may be etched, which exposes the substrate and a side portion of the channel layer 155 in a cavity. After the substrate and the side portion of the channel layer 155 are exposed, the selective epitaxial growth may be performed to grow epitaxial layers to fill the cavity. The epitaxial layers electrically contact the exposed side portion of the channel layer 155. Because the GLS's 163 are configured in the middle between the GLS's 171, void formation may be prevented when the epitaxial layers are grown to fill the cavity.

Thereafter, similar to the device 100, the stack layers 142 may be etched away and replaced by the conductor layers such as W layers. The conductor layers are configured as the word lines of the 3D memory device 300 and the channel layers 155 are configured as the bit lines. Then, deposition of an oxide layer and an etch process may be used to expose the epitaxial layer at the bottom of the GLS's 163 and 171. Electrically conductive materials may be deposited in the GLS's 163 and 171 to form the first ACS's and second ACS's. The first and second ACS's each extend through the layer stack 140 and electrically contact the epitaxial layers. After that, other fabrication steps or processes are performed to complete fabrication of the device 300.

Since the GLS 163 has a diamond-shaped cross-section in the X-Y plane, the first ACS's, which are formed in the GLS's 163, also have a diamond-shaped cross-section in the X-Y plane. Further, similar to the device 100, the first ACS's extend in a noncontinuous manner and are spaced apart from each other along the X direction, and the second ACS's extend in a continuous manner along the X-direction. Further, the second ACS's divide the NAND memory cells into multiple memory block regions. Each memory block region may be arranged between a pair of the second ACS's in the Y direction. The memory block may include a channel hole region that includes the noncontinuous first ACS's. In some other embodiments, the GLS's 163 and thus the first ACS's may extend in a noncontinuous manner along the X direction and the Y direction respectively.

Figure 16:
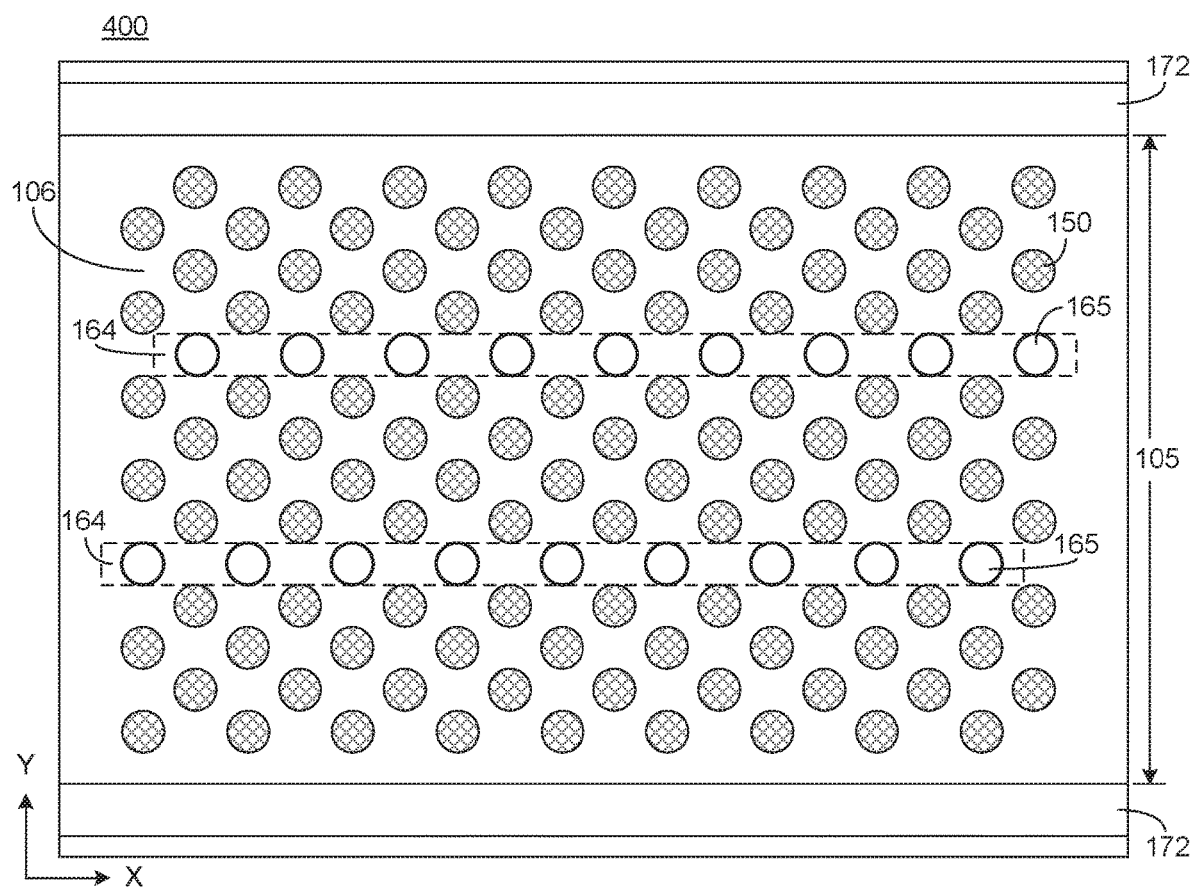
FIG. 16 illustrates schematically a top view of another 3D memory device according to embodiments of the present disclosure.

FIG. 16 schematically shows a top view of another 3D memory device 400 according to embodiments of the present disclosure. Cross-sectional views of the device 400 are omitted for simplicity. The structure of the 3D memory device 400 can be similar to that of the devices 100 and 300, but a first GLS region 164 of the device 400 is different from the first GLS region 160 of the device 100 and the first GLS region 162 of the device 300.

Similar to the device 100 and 300, the channel holes 150 of the device 400 are configured to extend in the Z direction and form a pattern in the X-Y plane. As shown in FIG. 16, NAND memory cells of the 3D memory device 400 may be divided into multiple memory block regions (not shown) by GLS's 172. The GLS's 172 may have the same structure as or a similar structure to that of the GLS 170 of the device 100 or the GLS 171 of the device 300. A memory block region 105, separated from other memory block regions (not shown), may be configured between the pair of the GLS's 172 and include a channel hole region 106. The channel hole region 106 may include the first GLS regions 164 that may include multiple GLS's 165 around the middle region between the GLS's 172. In some embodiments, the GLS 165 may have the same shape and dimensions as that of the GLS 161 of the device 100. In some other embodiments, the GLS 165 may have a different shape or different dimensions from that of the GLS 161, such as a square shape, an oval shape, or another shape.

Further, in contrast to the devices 100 and 300 where the GLS's 161 or 163 form a single row extending along the X direction, the GLS's 165 may form two rows each extending along the X direction. In a row, the GLS's 165 extend noncontinuously and are spaced apart from each other. In some embodiments, adjacent GLS's 165 may be spaced apart by a constant distance. In some other embodiments, adjacent GLS's 165 may be spaced apart by distances of different values. In some embodiments, the two rows of GLS's 165 may be arranged around the middle region between the GLS's 172 and spaced apart by a predetermined distance.

In some other embodiments, more than two rows of the GLS's 165 may be arranged around the middle region between the GLS's 172. As such, the GLS's 165 may be configured to extend along both the X direction and the Y direction. That is, the GLS's 165 may be configured to form a suitable pattern in the X-Y plane in the memory block region 105 or between the GLS's 172. In some embodiments, as in FIG. 16, the GLS's 165 may extend over a longer range along the X direction than along the Y direction.

Because adjacent GLS's 165 are spaced apart by at least a certain distance, the gate electrodes of each NAND memory cell in the memory block region 105 are electrically connected. As such, the first GLS regions 164 or the GLS's 165 may be viewed as splitting the channel hole region 106 into three electrically connected portions. Hence, the functionality of the memory block region 105 is not affected.

When more than one row of the GLS's 165 are formed between a pair of the GLS's 172, the process to etch a sacrificial layer, e.g., the layers 130 and 142 of the device 100, may become faster and more complete. Similarly, the growth rate of epitaxial layer in a cavity, e.g., the growth rate of the layer 184 in the cavity 181 of the device 100, may become more even to prevent formation of voids. In addition, in some other embodiments, when more channel holes are arranged in a memory block region, the distance between the GLS's 172 may increase along the Y direction. The distance between the GLS's 172 may become so large such that one row of the GLS's 165 may not be enough to prevent void formation in a selective epitaxial growth in a cavity (e.g., the growth of the layer 184 in the cavity 181 of the device 100) or incomplete etch of the sacrificial stack layers (e.g., the layers 142 of the device 100). Hence, multiple rows of the GLS's 165 may be desirable for preventing voids and incomplete etch in some embodiments.

Similar to the devices 100 and 300 but not shown in the figures, the device 400 may include the substrate 110 and the layer stack 140 deposited above the substrate. The device 400 also may include the functional layers 151, the channel layers 155, the first ACS's, and the second ACS's, which vertically extend through the layer stack 140 along the Z direction. Description of such a structure is omitted or not repeated in detail.

The fabrication method for the 3D NAND memory device 400 may use one or more processes that are the same as or similar to those used for the devices 100 and 300. For example, one or more deposition processes, one or more etch processes, and/or one or more filling processes used for the devices 100 and 300 may be used in the fabrication of the device 400. Description of such fabrication processes is omitted or not repeated in detail.

Figure 17:
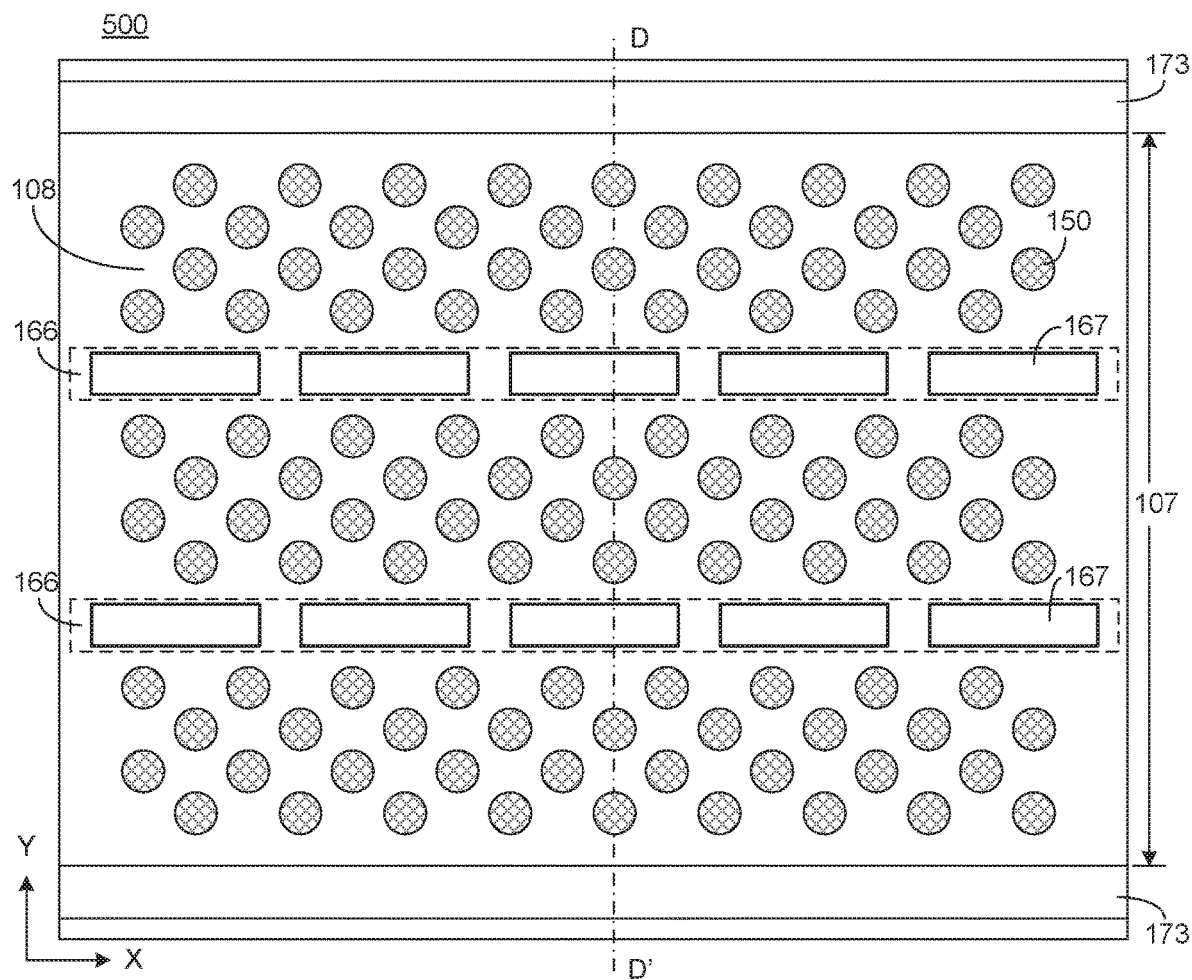
FIGS. 17 and 18 illustrate schematically a top view and a cross-sectional view of another 3D memory device after GLS's are formed according to embodiments of the present disclosure.
Figure 18:
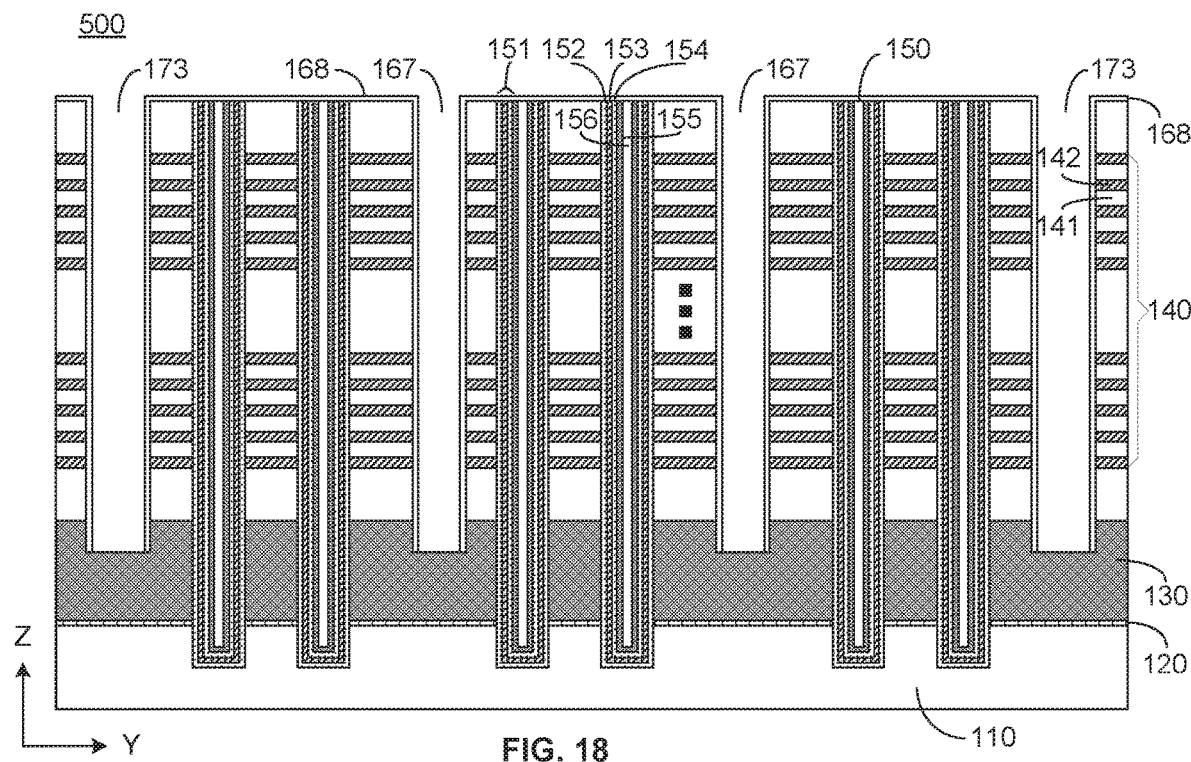
Figure 19:
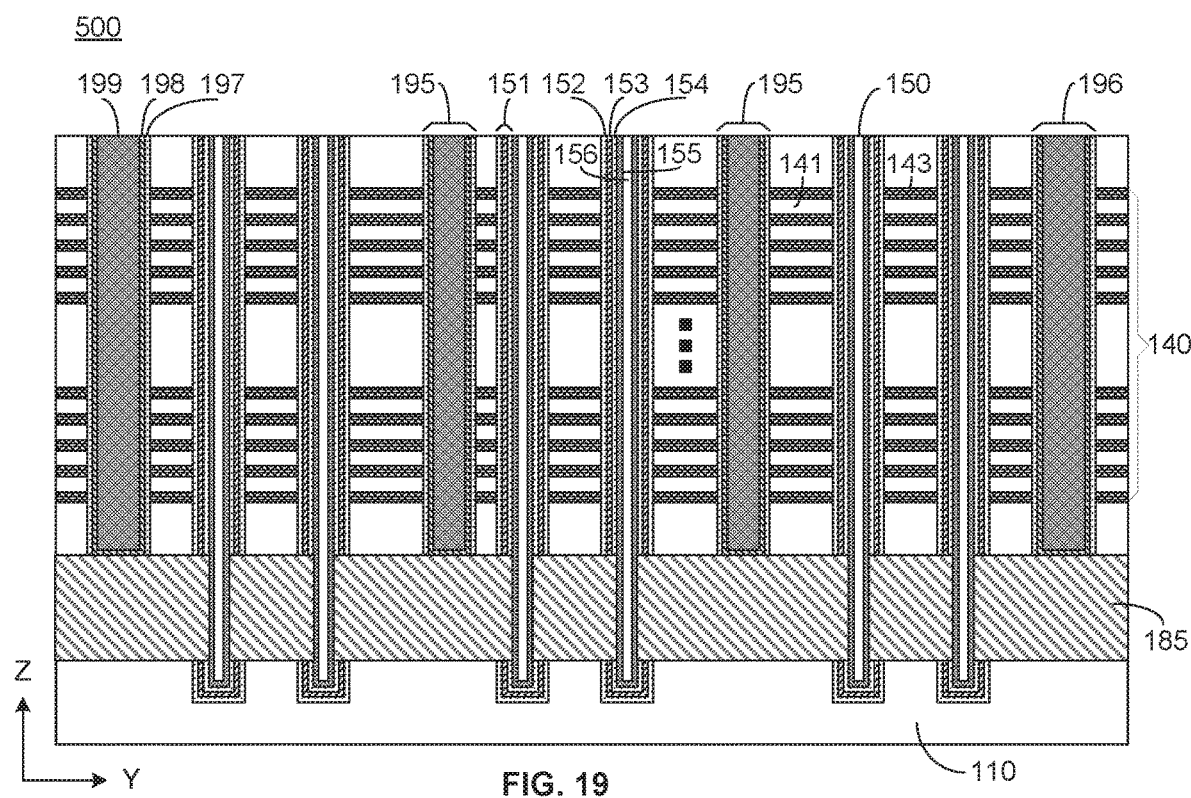
FIGS. 19 and 20 illustrate schematically a cross-sectional view and a top view of the 3D memory device shown in FIGS. 17 and 18 after several fabrication steps according to embodiments of the present disclosure.

FIGS. 17, 18, 19, and 20 schematically show top views and cross-sectional views of another 3D memory device 500 according to embodiments of the present disclosure. The cross-sectional view shown in FIG. 18 is taken along a line DD' of FIG. 17. The cross-sectional view shown in FIG. 19 is taken along a line EE' of FIG. 20. The structure of the 3D memory device 500 can be similar to that of the devices 100, 300, and/or 400, but a first GLS region 166 of the device 500 is different than the first GLS region 160 of the device 100, the first GLS region 162 of the device 300, and the first GLS region 164 of the device 400.

Similar to the devices 100, 300, and 400, the channel holes 150 of the device 500 are configured to extend in the Z direction and form a pattern in the X-Y plane. As shown in FIG. 17, NAND memory cells of the 3D memory device 500 may be divided into multiple memory block regions (not shown) by GLS's 173. The GLS's 173 may have the same structure as or a similar structure to that of the GLS 170 of the device 100 or the GLS 171 of the device 300. A memory block region 107 may include a channel hole region 108. The memory block region 107 may be configured between a pair of the GLS's 173 and separated from other memory block regions (not shown) by the GLS's 173. The channel hole region 108 may include the first GLS region 166 that may include multiple GLS's 167 around the middle region between the GLS's 173. Similar to the devices 100, 300, and 400, the GLS 167 extends continuously in the Z direction and extends noncontinuously in the X direction. The cross-section of the GLS 167 may have various shapes in the X-Y plane, such as a rectangular shape shown in FIG. 17.

Similar to the device 400 but different than the devices 100 and 300, the GLS's 167 may form two rows parallel to the GLS's 173 and extending along the X direction. In some embodiments, the two rows of GLS's 167 may be arranged around the middle region between the GLS's 173 and spaced apart by a predetermined distance. In each row, the GLS's 167 extend noncontinuously and are spaced apart from each other. In some embodiments, adjacent GLS's 167 may be spaced apart by a constant distance in the X direction. In some embodiments, adjacent GLS's 167 may be spaced apart by distances of different values in the X direction. In some other embodiments, more than two rows of the GLS's 167 may be arranged around the middle region between the GLS's 173. As such, the GLS's 167 may be configured to extend along both the X direction and the Y direction and form a 2D pattern in the X-Y plane in the memory block region 107 or between the GLS's 173. In some embodiments, the GLS's 167 may extend over a longer range along the X direction than along the Y direction.

As adjacent GLS's 165 are spaced apart by at least a certain distance along the X direction, Y direction, or another direction between the X and Y directions, the gate electrodes of each NAND memory cell in the memory block region 107 are electrically connected. As such, the first GLS regions 166 or the GLS's 167 may be viewed as splitting the channel hole region 108 into three electrically connected portions. Hence, the functionality of the memory block region 107 is not affected by the GLS's 167.

Similar to the device 400, when more than one row of the GLS's 167 are arranged between the pair of the GLS's 173, the process to etch a sacrificial layer, e.g., the layer 130 or 142 of the device 100, may become faster and more complete compared to a scenario when the GLS's 167 don't exit. In addition, the growth rate of epitaxial layers in a cavity, e.g., the growth rate of the layer 184 in the cavity 181 of the device 100, may become more even to prevent formation of voids. Further, in some other embodiments, when more channel holes are arranged between the GLS's 173, the distance between the GLS's 173 may increase accordingly. The distance between the GLS's 173 may become so large such that one row of the GLS's 167 may not be enough to prevent void formation in a selective epitaxial growth in a cavity (e.g., the layer 184 in the cavity 181 of the device 100) or incomplete etch of the sacrificial stack layers (e.g., the layers 142 of the device 100). Hence, multiple rows of the GLS's 167 may be needed for preventing void formation and incomplete etch in some embodiments.

Similar to the devices 100, 300, and 400, as shown in FIG. 19, the device 500 may include the substrate 110, an epitaxial layer 185, the layer stack 140, first ACS's 195, and second ACS's 196.

The fabrication method for the 3D NAND memory device 500 may use one or more processes that are the same as or similar to those used for the devices 100, 300, and 400. For example, one or more deposition processes, one or more etch processes, and/or one or more filling processes used for the devices 100, 300, and 400 may be used in the fabrication of the device 500.

As shown in FIGS. 18 and 19, when the 3D memory device 500 is fabricated, the cover layer 120 may be deposited over a top surface of the substrate 110 by CVD, PVD, ALD, or a combination of two or more of these processes. Next, similar to the devices 100, 300, and 400, a sacrificial layer, such as the polysilicon layer 130, and the layer stack 140 including alternating stack layers 141 and 142 may be deposited sequentially over the cover layer 120. Similar to the devices 100, 300, and 400, the stack layers 141 and 142 of the device 500 also may exemplarily include silicon oxide and silicon nitride, respectively. As shown in FIGS. 17 and 18, similar to the devices 100, 300, and 400, the device 500 also may include the channel holes 150, the functional layers 151, and the polysilicon channel layers 155 (semiconductor channels). The functional layers 151 are formed on the sidewalls and bottom surfaces of the channel holes 150 in the same way as that for the device 100. The functional layer 151 may exemplarily include a silicon oxide layer as the blocking layer 152 deposited on the sidewall and bottom of the channel hole 150, a silicon nitride layer as the charge trap layer 153 deposited on a surface of the blocking layer 152, and a silicon oxide layer as the tunnel insulation layer 154 deposited on a surface of the charge trap layer 153. The polysilicon channel layer 155 may be deposited on a surface of the tunnel insulation layer 154. The channel holes 150 may be filled with the dielectric material 156.

Next, the GLS's 167 and 173 may be formed. As shown in FIG. 17, the cross-section of the GLS 167 has a rectangular shape in the X-Y plane. Then, similar to the device 100, GLS spacers 168 may be deposited and selectively etched to expose the sacrificial layer 130, as shown in FIG. 18. Next, the sacrificial layer 130, the cover layer 120, a portion of the GLS spacers 168, and a portion of the functional later 151 close to the substrate may be etched out, which exposes the substrate and a side portion of the channel layer 155 in a cavity. After the substrate and the side portion of the channel layer 155 are exposed, the selective epitaxial growth may be performed to grow epitaxial single crystalline silicon and polysilicon layers on the substrate and the side portion of the channel layer 155. The epitaxial growth fills the cavity and an epitaxial layer 185 is formed. The epitaxial layer 185 electrically contacts the side portion of the channel layer 155. Because the two rows of the GLS's 167 are configured in the middle between the GLS's 173, void formation may be prevented when the epitaxial layer 185 is grown to fill the cavity.

Thereafter, similar to the devices 100, 300, and 400, the remaining portion of the GLS spacers 168 and the sacrificial stack layers 142 may be etched away, and the layers 142 may be replaced by the conductor layers 143 such as W layers. Because two rows of the GLS's 167 are configured in the middle between the GLS's 173, the sacrificial stack layers 142 may be etched completely. Thus, the conductor layers 143 may be deposited properly without issues resulting from the incomplete etch of the layer 142. The conductor layers 143 are configured as the word lines of the 3D memory device 500 and the channel layers 155 are configured as the bit lines. Next, the first ACS's 195 and second ACS's 196 are fabricated. A deposition process may be performed to form an electrical isolation layer, such as a silicon oxide layer 197, on the sidewalls and bottom surfaces of the GLS's 167 and 173. The layer 197 may be selectively etched to expose the epitaxial layer 185 at the bottom of the GLS's 167 and 173.

Figure 20:
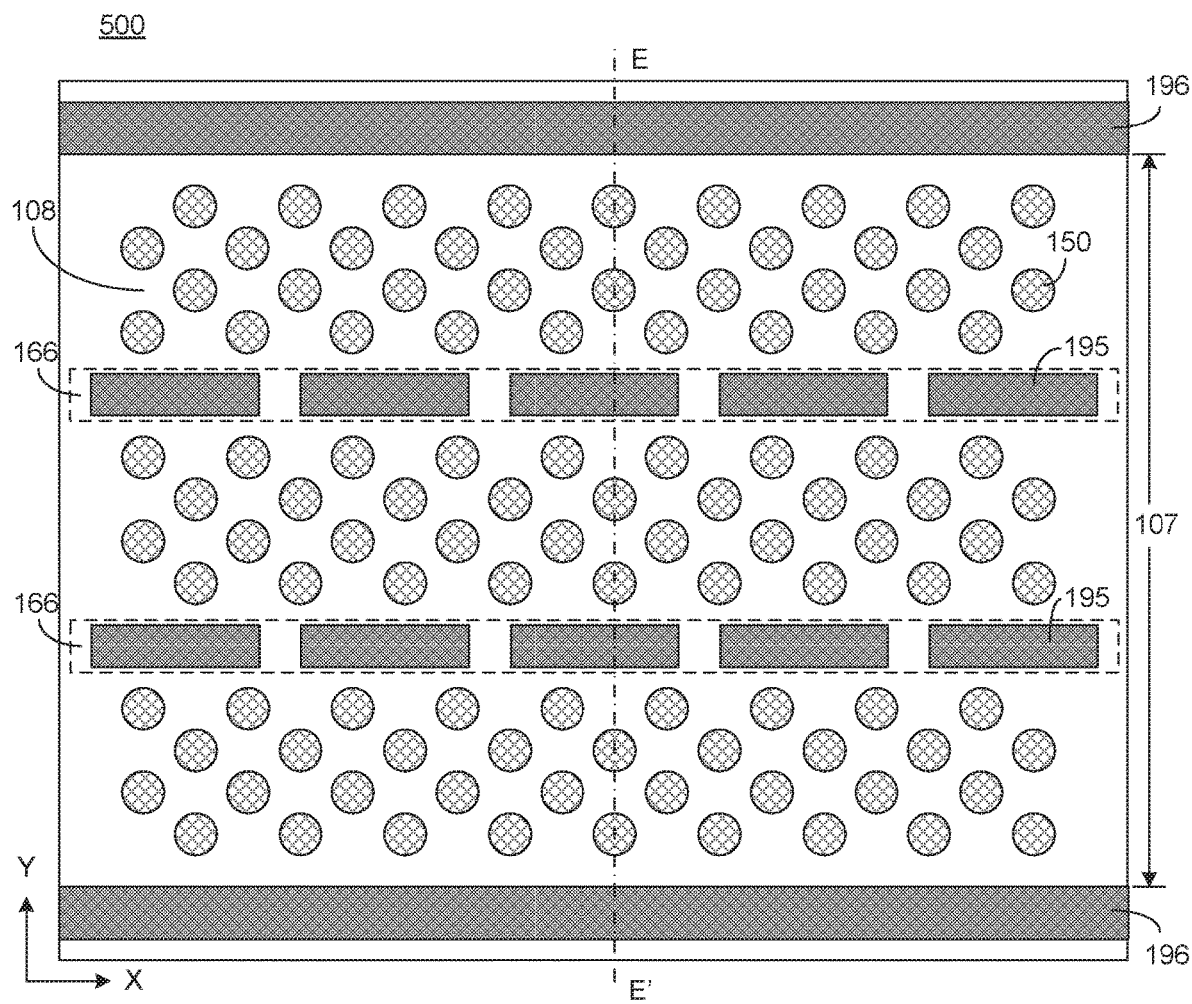

Next, other processes may be performed to form the first ACS's 195 and second ACS's 196 in the GLS's 167 and 173. As shown in FIG. 19, a conductive layer 198 including a conductive material such as titanium nitride, W, Co, Cu, Al, doped silicon, or silicide may be deposited to cover the silicon oxide layer 197 and electrically contact the layer 185 at the bottom of the GLS's 167 and 173. The GLS's then may be filled with a conductive material 199 such as doped polysilicon. FIG. 20 schematically shows a top view after the GLS's are filled to form the first ACS's 195 and second ACS's 196. As shown in FIG. 19, after the first ACS's 195 and second ACS's 196 are formed, they become electrically conductive channels, extending through the layer stack 140 and electrically contacting the epitaxial layer 185. After that, other fabrication steps or processes are performed to complete fabrication of the device 500.

Since the GLS 167 has a rectangular cross-section in the X-Y plane, the first ACS's 195, which are formed in the GLS's 167, also have a rectangular cross-section in the X-Y plane. Further, similar to the devices 100, 300, and 400, the first ACS's 195 extend in a noncontinuous manner and spaced apart along the X direction, and the second ACS's 196 extend from the left side to the right side of the memory hole region 107 in a continuous manner along the X direction. Further, the second ACS's 196 divide the NAND memory cells of the device 500 into multiple memory block regions (not shown). Each memory block region, e.g., the memory block region 107, may be arranged between a pair of the second ACS's 196 in the Y direction. Additionally, each memory block region may include a channel hole region that includes the noncontinuous first ACS's 195. As shown in FIGS. 17 and 19, the first ACS's 196 may extend in a noncontinuous manner along the X direction and the Y direction respectively. That is, in the memory block region 107 or between the pair of the second ACS's 196, the first ACS's 195 may be configured to form a pattern, such as a 2D pattern, in the X-Y plane. As the second ACS's 196 extend continuously from the left side to the right side in the X direction, the first ACS's 195 may extend over a longer range along the X direction than along the Y direction.

In some embodiment, the spacing between adjacent first ACS's 195 may be a fixed value in the X direction. In some other embodiment, the spacing between adjacent first ACS's 195 may include different values in the X direction. In addition, in some embodiments, the GLS's 167 may have the same shape or dimensions in the channel hole region 108. In some other embodiments, the GLS's 167 may have different shapes or dimensions in the channel hole region 108. Accordingly, in some embodiments, the first ACS's 195 may have the same shape or dimensions in the channel hole region 108. In some other embodiments, the first ACS's 195 may have different shapes or dimensions in the channel hole region 108.

The first ACS's 195 are arranged noncontinuous, not in contact with each other, and spaced apart by at least a given distance. As such, the space between adjacent first ACS's 195 provides electrical connection among the NAND memory cells. The first ACS's 195 may be viewed as splitting the channel hole region 108 into three electrically connected portions. Hence, the functionality of the memory block in the memory block region, such as the region 107, is not affected by the arrangement of the first ACS's 195.

Figure 21:
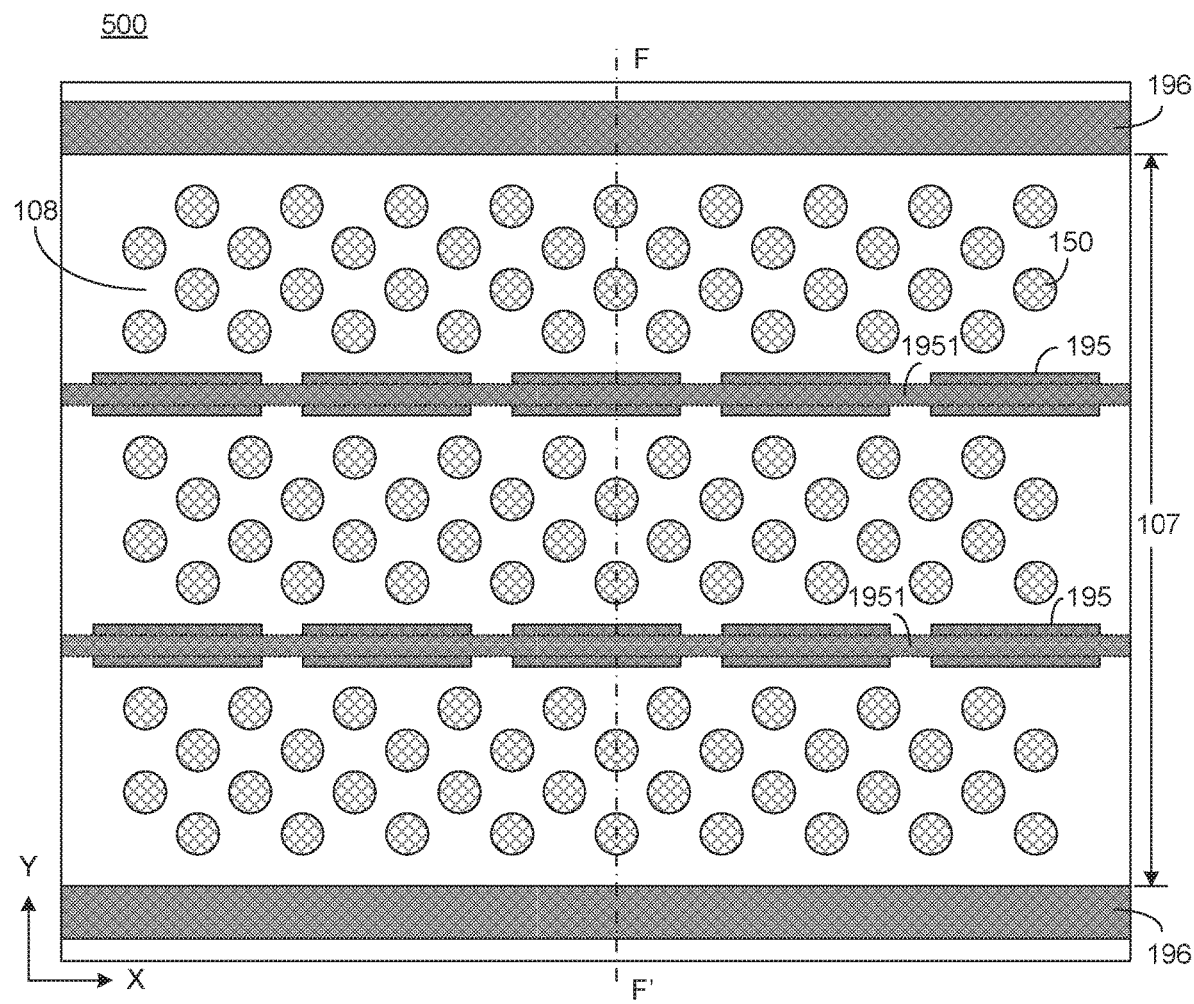
FIGS. 21 and 22 illustrate schematically a top view and a cross-sectional view of the 3D memory device shown in FIGS. 17 and 18 with an additional feature according to embodiments of the present disclosure.
Figure 22:
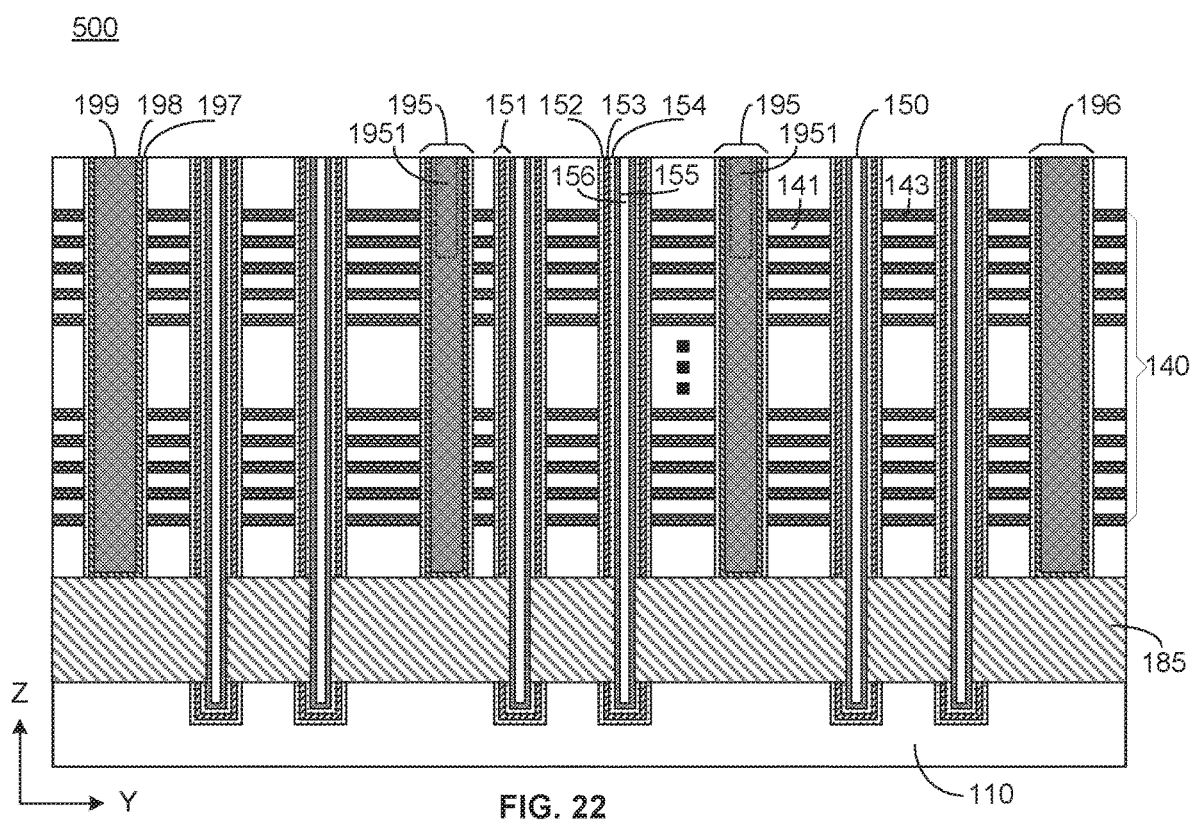

FIGS. 21 and 22 schematically show a top view and a cross-sectional view of the 3D memory device 500 with an additional feature according to embodiments of the present disclosure. The cross-sectional view shown in FIG. 22 is taken along a line FF' of FIG. 21. The additional feature is the top select gate (TSG) cut. Regions 1951 represent the TSG cut and are indicated with dotted lines in FIGS. 21 and 22. As illustrated in FIGS. 21 and 22, the TSG cut has a narrower width than that of the first ACS 195 in the Y direction and extends continuously in the X direction from the left side to the right side of the channel hole region 108. In the vertical direction (i.e., the Z direction), the TSG cut extends within a limited range and only partially through the layer stack 140. Hence, the region 1951 and the first ACS's 195 partially overlap in the channel hole region 108 or the memory block region 107.

In some embodiments, one row of the noncontinuous first ACS's 195 may be configured along with the TSG cut between the second ACS's 196. For example, if there are thirteen rows of the channel hole 150 between the second ACS's 196 along the Y direction, in some embodiments, the seventh row of the channel holes 150 from the second ACS 196 may be used to form a row of the first ACS's 195. Then, six rows of channel holes 150 are arranged on each side of the row of the first ACS's 195. In addition, multiple rows of the first ACS's 195 may be configured along with multiple TSG cuts between the second ACS's 196 along the Y direction. For example, in some embodiments, when there are 7N−1 rows of the channel holes 150, where N is an integer larger than 2, the seventh row from the ACS 196 may be used to form the first row of the first ACS's 195, the fourteenth tow may be used to form the second row of the first ACS's 195, and so on. In such a scenario, between two adjacent rows of the first ACS's 195 or between the ACS 196 and an adjacent row of the ACS 195, there are six rows of the channel holes 150.

As illustrated in FIGS. 21 and 22, a smaller spacing between adjacent ACS's 195 along the X direction means larger areas of the ACS's 195 in the X-Z plane and thus is desirable for the etching and filling processes described above. However, if the spacing between adjacent ACS's 195 becomes too small, reliability issues may occur since adjacent ACS's 195 may contact each other. Hence, the length of the ACS 195 along the X direction should be optimized.

By using the disclosed memory structures and methods, noncontinuous GLS's are formed between continuous GLS's in a memory block region without affecting the functionality of the memory block. The noncontinuous GLS's improve the selective epitaxial growth in a cavity. Hence, void formation may be prevented and leakage issues of electrical current may be avoided. The noncontinuous GLS's also enhance etch of sacrificial stack layers, which may prevent incomplete gate electrode from happening. As such, the quality and reliability of the 3D memory device may be improved.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure.

Hence, the content of the specification should not be construed as a limitation to the present disclosure.

What is claimed is:

1. A method for fabricating a three-dimensional (3D) memory device, comprising:
   forming a layer stack over a substrate;
   forming an epitaxial layer on a side portion of a channel layer that extends through the layer stack and on the substrate; and
   forming a plurality of first gate line slits (GLS's) and a plurality of second GLS's extending through the layer stack,
   wherein
   each second GLS extends continuously along a first direction, and is arranged along a second direction to form a memory block, and
   the plurality of first GLS's are formed spaced apart from each other between adjacent second GLS's, and are aligned along the first direction.

2. The method according to claim 1, further comprising:
   forming a channel hole extending through the layer stack;
   forming a functional layer on a side wall and a bottom surface of the channel hole, the functional layer including a blocking layer, a charge trap layer, and/or a tunnel insulation layer; and
   filling the channel hole with a dielectric material,
   wherein the channel layer is deposited adjacent to the functional layer.

3. The method according to claim 2, further comprising:
   removing a portion of the functional layer to expose the side portion of the channel layer before performing an epitaxial growth and forming the epitaxial layer.

4. The method according to claim 1, before forming the epitaxial layer, further comprising:
   depositing a sacrificial layer over the substrate;
   depositing a spacer layer on a sidewall and a bottom surface of one of the plurality of first GLS's;
   removing a portion of the spacer layer on the bottom surface to expose a part of the sacrificial layer; and
   removing the sacrificial layer.

5. The method according to claim 4, after removing the sacrificial layer, further comprising:
   removing a cover layer on the substrate to expose a surface of the substrate.

6. The method according to claim 1, further comprising:
   filling the plurality of first GLS's with at least one electrically conductive material to form a plurality of first array common sources (ACS's); and
   filling the plurality of second GLS's with at least one electrically conductive material to form a plurality of second ACS's,
   wherein the plurality of first ACS's and the plurality of second ACS's electrically connect with the epitaxial layer.

7. The method according to claim 1, further comprising:
   one or more first GLS regions, extending along the first direction and arranged along the second direction between the adjacent second GLS's,
   wherein
   the plurality of first GLS's are formed in each first GLS region.

8. The method according to claim 1, wherein:
   the channel layer passes through the epitaxial layer and further into the substrate.

9. A method for fabricating a three-dimensional (3D) memory device, comprising:
   forming a layer stack over a substrate;
   forming an epitaxial layer on a side portion of a channel layer that extends through the layer stack and on the substrate; and
   forming a plurality of first array common sources (ACS's) and a plurality of second ACS's extending through the layer stack,
   wherein
   each second ACS extends continuously along a first direction, and is arranged along a second direction to define a memory block, and
   the plurality of first ACS's are formed spaced apart from each other between adjacent second ACS's, and are aligned along the first direction.

10. The method according to claim 9, further comprising:
    forming a plurality of first gate line slits (GLS's) and a plurality of second GLS's extending through the layer stack;
    filling the plurality of first GLS's with at least one electrically conductive material to form the plurality of first ACS's; and
    filling the plurality of second GLS's with at least one electrically conductive material to form the plurality of second ACS's.

11. The method according to claim 9, further comprising:
    forming a channel hole extending through the layer stack; and
    forming a functional layer on a sidewall of the channel hole, the functional layer including a blocking layer, a charge trap layer, and/or a tunnel insulation layer,
    wherein the channel layer is deposited adjacent to the functional layer.

12. The method according to claim 11, further comprising:
    removing a portion of the functional layer to expose the side portion of the channel layer before forming the epitaxial layer.

13. The method according to claim 9, further comprising:
    one or more first ACS regions, extending along the first direction and arranged along the second direction between the adjacent second ACS's,
    wherein
    the plurality of first ACS's are formed in each first ACS region.

14. The method according to claim 9, wherein:
    the channel layer passes through the epitaxial layer and further into the substrate.

15. The method according to claim 9, before forming the epitaxial layer, further comprising:
    depositing a sacrificial layer over the substrate;
    forming a plurality of first gate line slits (GLS's) and a plurality of second GLS's extending through the layer stack;
    depositing a spacer layer on a sidewall and a bottom surface of one of the plurality of first GLS's;
    removing a portion of the spacer layer on the bottom surface to expose a part of the sacrificial layer; and
    removing the sacrificial layer.

16. The method according to claim 15, after removing the sacrificial layer, further comprising:
    removing a cover layer on the substrate to expose the substrate.

17. The method according to claim 9, wherein the plurality of first ACS's partially overlap a region of a top select gate (TSG) cut.

18. The method according to claim 9, wherein the plurality of first ACS's and the plurality of second ACS's are electrically connected with the epitaxial layer.

\* \* \* \* \*